(12) United States Patent
Hidaka

(10) Patent No.: US 6,628,554 B2
(45) Date of Patent: Sep. 30, 2003

(54) MIS SEMICONDUCTOR DEVICE HAVING IMPROVED GATE INSULATING FILM RELIABILITY

(75) Inventor: Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 134 days.

(21) Appl. No.: 09/813,796

(22) Filed: Mar. 22, 2001

(65) Prior Publication Data

US 2002/0024059 A1 Feb. 28, 2002

(30) Foreign Application Priority Data

Aug. 30, 2000 (JP) ........................................ 2000-260379

(51) Int. Cl.[7] ................................................. G11C 7/00
(52) U.S. Cl. .................. 365/189.09; 365/154; 365/156; 365/201
(58) Field of Search ........................... 365/189.09, 154, 365/156, 201

(56) References Cited

U.S. PATENT DOCUMENTS

| | | | | |
|---|---|---|---|---|
| 5,379,260 A | * | 1/1995 | McClure ...................... | 365/201 |
| 5,694,364 A | * | 12/1997 | Morishita et al. ........... | 365/201 |
| 5,956,279 A | * | 9/1999 | Mo et al. ..................... | 365/201 |
| 6,107,134 A | * | 8/2000 | Lu et al. ...................... | 432/239 |
| 6,414,889 B1 | * | 7/2002 | Chen et al. .................. | 365/201 |

OTHER PUBLICATIONS

"A Precise On–Chip Voltage Generator for a Gigascale DRAM with a Negative Word–Line Scheme", by Tanaka et al., IEEE Journal of Solid–State Circuits, vol. 34, No. 8 (Aug. 1999), pp. 1084–1090.

"Ultra LSI Memory", by Kiyoo Ito, Advanced Electronics Series (Nov. 5, 1994), published by Baifukan, pp. 351–371.

"An Experimental 256–Mb DRAM with Boosted Sense–Ground Scheme", by Asakura et al., IEEE Journal of Solid–State Circuits, vol. 29, No. 11 (Nov. 1994), pp. 1303–1309.

* cited by examiner

Primary Examiner—David Nelms
Assistant Examiner—Connie C. Yoha
(74) Attorney, Agent, or Firm—McDermott, Will & Emery

(57) ABSTRACT

A reliability evaluation value of a gate insulating film of an insulated gate type (MIS) transistor in an unselected state is set to a value equal to or smaller than the reliability evaluation value of the gate insulating film of the MIS transistor in a selected state. An electric field applied to the gate insulating film is determined in accordance with the reliability evaluation value. Therefore, it is possible to the gate insulating film applied electric field of the MIS transistor in the unselected state lower than the electric field in the selected state to assure the reliability of the gate insulating film of the MIS transistor in the unselected state. Thus, the reliability of the gate insulating film of the MIS transistor in the unselected state is assured, and a semiconductor device with an improved gate dielectric characteristics.

6 Claims, 16 Drawing Sheets

FIG. 4

|   | VCH   | Vcca  | VNN    | Eox1 | Eox2 |
|---|-------|-------|--------|------|------|
| a: | 2.7V  | 1.8V  | −0.8V  | 4.8M | 4.6M |
| b: | 2.55V | 1.65V | −0.65V | 4.6M | 4.1M |
| c: | 2.4V  | 1.5V  | −0.5V  | 4.3M | 3.6M |

FIG. 9

|   | VCH  | VDH  | Vbsg | Eox1 | Eox2 |
|---|------|------|------|------|------|
| d | 2.7V | 1.8V | 0V   | 4.8M | 3.2M |
| e | 2.7V | 1.8V | 0.3V | 4.3M | 3.2M |
| f | 2.7V | 1.8V | 0.5V | 3.9M | 3.2M |

: SAME AS CONVENTIONAL CASE, ASSURING OF RELIABILITY BY CONSIDERING V1 AND V2

: SAME AS CONVENTIONAL CASE, ASSURING OF RELIABILITY BY CONSIDERING V1 AND V2

US 6,628,554 B2

MIS SEMICONDUCTOR DEVICE HAVING IMPROVED GATE INSULATING FILM RELIABILITY

BACKGROUND OF THE INVENTION

1. Field of the Invention

The present invention relates to a semiconductor device, and particularly to improvement of reliability of a low-voltage MIS (insulated gate type field effect transistor) semiconductor device. More specifically, the present invention relates to improvement of the gate insulating film of an MIS transistor of a component of an MIS semiconductor memory device.

2. Description of the Background Art

In the case of a semiconductor memory device such as a DRAM (Dynamic Random Access Memory), an operating power supply voltage is lowered for high speed operation and reduced power consumption. However, a semiconductor memory device using an MIS transistor is accompanied by the following problems in lowering of a power supply voltage.

FIG. 27 is a diagram schematically showing a cross sectional structure of a memory cell of a DRAM. In FIG. 27, the memory cell includes N-type impurity regions 1002a and 1002b formed, separately from each other, on the surface of a P-type substrate region 1000, a gate-electrode layer 1005 formed above a channel region 1003 between the impurity regions 1002a and 1002b with a gate insulating film 1004 inlaid, a conductive layer 1006 connected to the N-type impurity region 1002b, and a cell plate electrode layer 1007 arranged facing the conductive layer 1006 through a capacitor insulating film (not shown).

The N-type impurity region 1002a is connected to the conductive layer 1008. The conductive layer 1008 constitutes a bit line BL, and the conductive layer 1006 and cell plate electrode layer 1007, together with a capacitor insulting film, constitute a memory cell capacitor. A cell plate voltage Vcp at an intermediate voltage level is supplied to the cell plate electrode layer 1007. The gate electrode layer 1005 constitutes a word line WL. A memory transistor is constituted of the N-type impurity regions 1002a and 1002b, gate electrode layer 1005, and substrate region 1000.

In lowering an operating power supply voltage, each parameter of a memory cell is scaled down in accordance with a predetermined scaling rule. However, to suppress a leak current between the source and drain of a memory transistor, or between the N-type impurity regions 1002a and 1002b, it is necessary to keep a threshold voltage Vtm of the memory transistor at a certain value or more. Even if an applied voltage of the gate electrode layer 1005 is equal to the ground voltage level, a current referred to as the so-called sub-threshold current flows. The sub-threshold current increases as the threshold voltage lowers in the case of an N-channel MIS transistor. Therefore, when the ground voltage is transferred to the bit line BL in accordance with data in other selected memory cell while H-level data at the power supply voltage level is stored in the N-type impurity region 1002b, the voltage level of the H-level data is lowered due to the sub-threshold current and the H-level data may be lost in the worst case. Moreover, in the case of a transistor of other peripheral circuit, the current consumption increases when a sub-threshold current increases.

It is necessary to write data at as high a voltage level as possible in a memory cell capacitor as H-level data, in order to lengthen the data retention time. Therefore, it is necessary to set a voltage level of a selected word line WL (gate electrode layer 1005) to a voltage level equal to or higher than the sum of an array power supply voltage Vcca and a threshold voltage Vtm of a memory transistor. When such a high voltage is applied to the gate electrode layer 1005, an electric field to be applied to the gate insulating film 1004 of a memory transistor increases. To prevent the dielectric breakdown of the gate insulating film due to the large electric field, it is necessary to increase the thickness of the gate insulating film 1004. Therefore, the thickness of the gate insulating film of an MIS transistor of the DRAM is determined by the thickness of the gate insulating film 1004 of the memory transistor, and it is impossible to improve the performance of a transistor of peripheral circuitry because the absolute value of a threshold voltage of a MIS transistor of the peripheral circuitry increases and a high-speed operation cannot be performed. It can be considered to make the transistor of the peripheral circuit different in thickness of the gate insulating film from the memory transistor. In this case, however, it is necessary to fabricate the peripheral transistor and the memory cell transistor in manufacturing steps different from each other and the number of fabrication steps increases.

Moreover, to raise the threshold voltage of the memory transistor, it is necessary to raise the impurity concentration (channel doping concentration) of the surface of the channel region 1003. In this case, such problems occur that an electric field (built-in electric field) applied across the PN junction between the channel region 1003 and impurity region 1002b increases. Consequently, a leak current at the PN junction increases, electric charges stored in the conductive layer 1006 are discharged, the voltage level of H-level data lowers, and the data retention characteristics deteriorates.

The following approaches have been proposed so far in order to solve the foregoing problems.

(1) Negative Voltage Word Line Scheme (Negative Word Line Scheme)

FIG. 28A is a diagram showing an electric equivalent circuit of a DRAM memory cell. In FIG. 28A, a memory cell MC includes a memory cell capacitor MS for storing information and a memory transistor MT for connecting the memory cell capacitor MS to a bit line BL in accordance with the voltage of a word line WL. Normally, bit lines BL and /BL are arranged in a pair and a memory cell is connected to either of the bit lines in the pair.

In the negative voltage word line scheme (NWL scheme), when a word line WL is held in an unselected state, it is set to a negative voltage VNN as shown in FIG. 28B. The threshold voltage of the memory transistor MT is lowered in accordance with the negative voltage VNN. Even if the threshold voltage Vtm is lowered, the negative voltage VNN is applied to the unselected word line WL and a state is realized in which the threshold voltage Vtm is equivalently high. The data in a selected memory cell is read onto the bit line BL. The bit line BL changes in voltage between the array power supply voltage Vcca (=VDH) and the ground voltage Vss (=VDL). It is assumed here that other word line is selected, L-level data is read to the bit line BL, and the bit line BL is set to the ground voltage Vss level. The unselected word line WL is kept at the negative voltage VNN level. When the memory cell MC shown in FIG. 28A is an unselected memory cell, the negative voltage VNN is applied between the gate and source of the memory transistor MT, and the word line WL enters the reverse biased state deeper than the state in the case in which the word line WL is kept at the ground voltage level. Therefore, even if the threshold voltage of the memory transistor MT is low, a sub-threshold current is completely suppressed.

Moreover, by lowering the threshold voltage Vtm, it is possible to lower the level of a voltage VCH transferred to a selected word line WL. Correspondingly, it becomes possible to decrease the thickness of the gate insulating film of the memory transistor MT. In addition, because the threshold voltage Vtm can be lowered, it is possible to lower the channel doping concentration, lower the built-in electric field of a PN junction in a channel region. Accordingly, the substrate leak current at the PN junction can be reduced to lengthen the data retention time.

(2) Boosted Sense Ground Scheme (BSG Scheme)

FIG. 29A is a diagram showing applied voltages of a word line and a bit line in accordance with the boosted sense ground scheme (hereinafter referred to as BSG scheme). As shown in FIG. 29A, in the BSG scheme, an array power supply voltage Vcca and a boosted sense ground voltage Vbsg are applied to a bit line BL as an H-level voltage VDH and an L-level voltage VDL, respectively. The boosted sense ground voltage Vbsg is slightly higher than the ground voltage Vss. The word line WL is kept at the ground voltage Vss when unselected, and set to the high voltage VCH when selected.

In the case of the BSG scheme, as shown in FIG. 29B, the boosted sense ground voltage Vbsg is applied to the bit line BL. Therefore, even if an unselected word line WL is set to the ground voltage Vss, the memory transistor has the gate and source set to a deep reverse biased state. Therefore, similarly to the case of the NWL scheme, it is possible to lower the threshold voltage Vtm of the memory transistor MT and accordingly to lower the high voltage VCH transferred to a selected word line. Thus, similarly to the case of the NWL scheme, it is possible to decrease the thickness of the gate insulating film of the memory transistor MT. Moreover, it is possible to lower the channel doping concentration of the memory transistor MT, to lengthen the data retention time.

FIG. 30 is a diagram showing applied voltages of a bit line and a word line of a conventional DRAM cell. The conventional DRAM cell includes a memory transistor MT formed of an MIS transistor having a comparatively high threshold voltage Vtm. In the conventional DRAM cell, a selected word line WL is driven up to a high voltage-Vpp level and a bit line BL changes in voltage between H-level voltage VDH and L-level voltage VDL. The L-level voltage VDL is kept at the ground voltage Vss level.

The high voltage Vpp is applied to the gate of the memory transistor of a selected memory cell. Therefore, when the bit line BL is kept at the ground voltage Vss, a voltage V1=Vpp is applied between the gate and source of the memory transistor. For an unselected memory cell, however, an unselected word line WL is kept at the ground voltage Vss level. Therefore, when the H-level voltage VDH (=array power supply voltage Vcca) is applied to the bit line BL, a voltage V2=VDH at highest is applied to a gate insulating film.

In the conventional DRAM cell, a voltage applied between the gate and source of the memory transistor of a selected memory cell becomes higher than that of the memory transistor of an unselected memory cell by a voltage $\Delta Vw=Vpp-VDH$. Therefore, the reliability of a memory cell of a conventional DRAM is decided by the reliability of the gate insulating film of the transistor of the selected memory cell.

FIG. 31 is a diagram showing voltages of a word line and a bit line of an NWL scheme DRAM. In the NWL scheme, an unselected word line is kept at the negative voltage VNN level and a selected word line WL is kept at the high voltage VCH level. A bit line BL changes in voltage between array power supply voltage Vcca (=VDH) and ground voltage Vss (=VDL). For an unselected memory cell, the maximum value V1n of voltages applied between the gate and source of a memory transistor is equal to VDH–VNN. In the case of a selected memory cell, the maximum value V2n of voltages applied between the gate and source of a memory transistor is equal to VCH. Therefore, depending on the voltage level of the negative voltage VNN, a voltage to be applied to the gate insulating film of the memory transistor of an unselected memory cell may be higher than a voltage applied to the gate insulating film of the memory transistor of the selected memory cell. Moreover, the maximum value V1n of voltages applied between the gate and source of an unselected memory cell rises by the absolute value of the negative voltage VNN, as compared to a conventional case.

FIG. 32 is a diagram schematically showing voltages of a word line WL and a bit line BL in the BSG scheme. In FIG. 32, in the BSG scheme, a maximum voltage is applied between the gate and source of a memory transistor of a selected memory when the bit line BL is kept at the level of a low level voltage VDL (=Vbsg), and a voltage of VCH–Vbsg is applied between the gate and source as the maximum voltage V2b. For an unselected memory cell, the maximum value V1b of voltages applied between the gate and source of a memory transistor is equal to the voltage VDH (=Vcca) because the unselected word line WL is kept at the ground voltage Vss level. Therefore, also in this case, although voltages applied between the gates and sources of memory transistors of selected and unselected memory cells are almost the same, a voltage applied across the gate insulating film of the memory transistor of the unselected memory cell becomes higher than that of the selected memory cell.

Particularly, when the reliability of the gate insulating film of a memory transistor is considered in view of a case in which the voltage level of an unselected word line is equal to a low level voltage VDL, that is, when the reliability is considered by utilizing the voltage amplitude of VCH–VDL=V1 of a selected word line and the voltage amplitude of VDH–VDL=V2 of a bit line as parameters, it is impossible to assure the reliability of the gage insulating film of an unselected memory cell in both the NWL and BSG schemes. Particularly, a gate edge is subject to an electric field higher than that of a gate inside due to the edge effect (fringe effect), it is impossible to completely assure the reliability of the memory transistor of the unselected memory cell.

In a semiconductor memory, unselected memory cells are an overwhelmingly majority, as compared to selected memory cells. Therefore, when the oxide film reduced thickness Tox of the gate insulating film of a memory transistor MT is to be decreased, reliabilities of the gate insulating films of all the memory cells are decided by the reliabilities of the memory cells in an unselected state, and it is impossible to completely assure the reliabilities of memory cells.

Moreover, a burn-in test is normally performed to test the reliability of the gate insulating film. In the burn-in test, however, a gate voltage is accelerated with the memory cell selection state focused on. Therefore, when an electric-field stress applied to a gate insulating film of a memory cell in an unselected state is close to or exceeds that of a memory cell in a selected state, a problem occurs that it is impossible to effectively perform a burn-in test for assuring the reliability of the memory cell in the case of a conventional burn-in mode.

The problem of the gate insulating film of the transistor of the memory cell as described above is not restricted to a semiconductor memory, but a general semiconductor integrated circuit suffers from similar disadvantages. That is, when the gate to source of a transistor in the unselected state such as the standby state is set to the reverse biased state in order to reduce a leak current, the same problem occurs. Particularly, when a transistor to be turned off in the standby state in a hierarchical power supply configuration is set to the reverse biased state, an electric field applied to a gate insulating film is increased in the transistors in the standby state.

Moreover, not only in the case of a DRAM but also in other semiconductor memory (e.g. SRAM (Static Random Access Memory)), when a component is formed of an MIS transistor and a word line is driven to a negative voltage, the same problem occurs.

SUMMARY OF THE INVENTION

It is an object of the present invention to provide semiconductor integrated circuit of a high reliability.

It is another object of the present invention to provide a semiconductor integrated circuit having an improved gate insulating film reliability and operating with a low power supply voltage.

It is still another object of the present invention to provide an integrated semiconductor memory circuit device operating with a low power supply voltage and improved in reliability of gate insulating film.

It is a further object of the present invention to provide a semiconductor memory capable of easily performing burn-in of an unselected memory cell.

It is a further another object of the present invention to provide a semiconductor integrated circuit capable of easily and accurately applying burn-in to a gate insulating film in the standby state.

A semiconductor device according to the first aspect of the present invention includes a bit line for transferring a signal changing between a first voltage and a second voltage higher than the first voltage, and a memory cell having an element for storing information, and a selection gate for connecting the element to the bit line when selected. The selection gate is constituted of an insulated gate type field effect transistor.

The semiconductor device according to the first aspect of the present invention further includes a word line connected to the selection gate of the memory cell for transferring a voltage determining selection/unselection of the element and a word-line voltage applying circuit for applying a voltage to the word line. The word line voltage applying circuit applies a third voltage out of the voltage changing range of the bit line when the element is unselected and a fourth voltage when the element is selected. The third voltage is at a voltage level for setting the reliability evaluation value of the insulating film of the selected gate below that when the fourth voltage is applied.

A semiconductor device according to another aspect of the present invention includes an internal circuit having a power supply node, a power supply voltage transfer line, a power supply control transistor constituted of an insulated gate type field effect transistor, connected between the power supply node and the power supply voltage transfer line and set to a high-impedance state when the internal circuit is unselected and to a low-impedance state when the internal circuit is selected, and a control circuit for applying a control signal to the gate of the power supply control transistor in response to an operation mode designation signal designating an operation mode of the internal circuit. The control circuit applies, as the control signal, a voltage at which the reliability evaluation value of a gate insulating film of the power control transistor in the high-impedance state is equal to or less than that of the gate insulating film of the power control transistor in the low-impedance state.

A semiconductor device according to still another aspect of the present invention includes an internal circuit having a plurality of sub circuits. The sub circuits include a first sub circuit coupled to a first power line transferring a first power source voltage, and a second sub circuit coupled to a second power line transferring a second power source voltage.

The semiconductor device according to the still another aspect of the present invention further includes a first power supply circuit connected to the first power line, for generating the first power source voltage, and a second power supply circuit connected to a second power line, for generating a voltage at a first voltage level independently of selection/unselection of the internal circuit. The reliability evaluation value of the gate insulating film of a transistor of the sub-circuit when the internal circuit is unselected is set to a value equal to or less than that when the internal circuit is selected.

A reliability evaluation value is represented by a monotonously increasing function of an electric field applied to a gate insulating film, as an example. Therefore, by decreasing the reliability evaluation value, the reliability of the gate insulating film is improved. By making the reliability evaluation value of the gate insulating film of a transistor in the unselected state equal to or less than that in the selected state, the state of an MIS transistor in the unselected state does not deteriorate the reliability of the whole circuit, and it becomes possible to improve the reliability of the whole circuit. Thereby, it is possible to reduce a power supply voltage and an oxide film reduced thickness of a gate insulating film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram showing a list of sample values of voltages in a first embodiment of the present invention;

FIG. 9 is a diagram showing a list of voltages of a BSG scheme semiconductor memory of the third embodiment of the present invention;

DESCRIPTION OF THE PREFERRED EMBODIMENTS

[First Embodiment]

Figure 1:
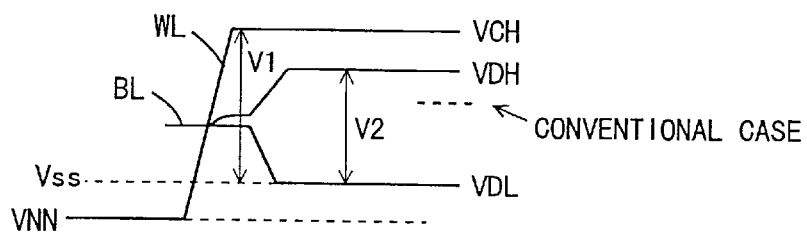
FIG. 1 is a diagram showing applied voltages and reliability parameters of NWL scheme word line and bit line.
Figure 33:
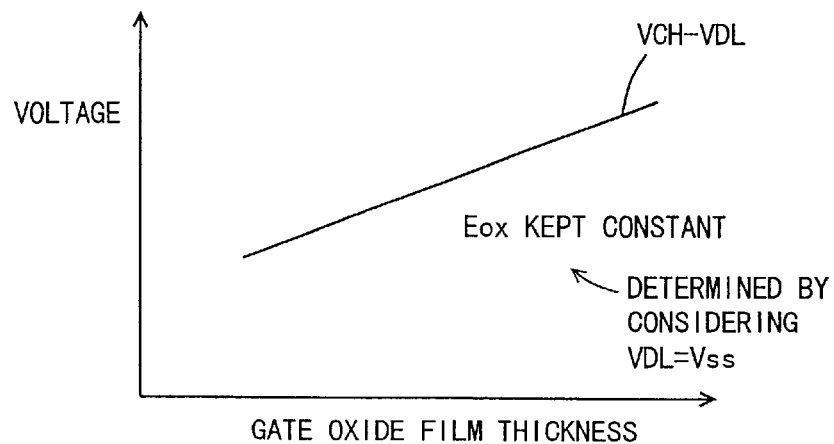
FIG. 33 is a diagram showing the relation between the gate oxide film thickness and the gate applied voltage of a conventional DRAM cell.

FIG. 1 is a diagram showing voltages of a word line WL and a bit line BL of an NWL scheme DRAM. In the case of the NWL scheme, a bit line BL changes in voltage to a high-level voltage VDH or a low-level voltage VDL. A selected word line WL is driven to a high voltage VCH. An unselected word line is kept at a negative voltage VNN. In this case, a selected word line voltage VCH–VDL=V1 on a selected word line and a bit line amplitude VDH–VDL=V2 are used as reliability evaluation parameters similarly to a conventional case. This is the same as the reliability evaluation scheme shown in FIG. 33 and is disclosed in "A Precise On-Chip Voltage Generator for a Gigascale DRAM with a Negative Word-Line Scheme", by TANAKA et al., in IEEE Journal of Solid State Circuits, Vol. 34, No. 8, August, 1999, pp. 1084–1090.

Figure 2:
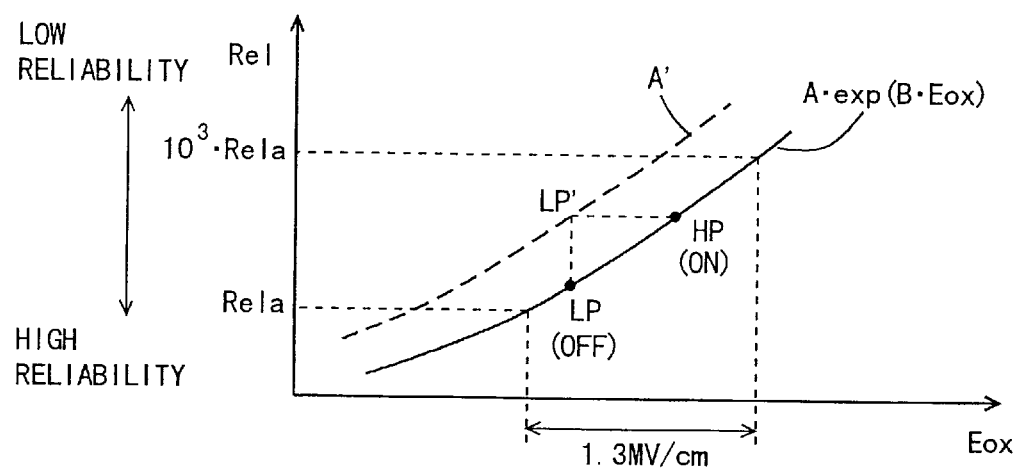
FIG. 2 is a diagram schematically showing an evaluation function showing the reliability of a gate insulating film.

FIG. 2 is a graph showing the reliability of the gate insulating film of an MIS transistor. In FIG. 2, a reliability factor Rel indicating the reliability of the gate insulating film is represented by a function, $A \cdot \exp(B \cdot Eox)$. Here, A and B denote factors determined in accordance with various conditions, and Eox denotes an electric field applied to the gate insulating film. The reliability factor Rel is represented by a monotonously increasing function of an applied electric field to the gate insulating film. The reliability of the gate insulating film deteriorates more as the applied electric field Eox increases in the same film thickness condition. Therefore, the fact that the value of the reliability factor Rel, or a reliability evaluation value is high represents that the reliability of the film is low.

In the case of the reliability factor Rel shown in FIG. 2, when the electric field Eox applied to the gate insulating film lowers by 1.3 MV/cm (approximately 1MV/cm), the reliability is improved up to 1000 times. As for a parameter used for reliability evaluation in the case of the NWL scheme, an electric field Eox1 applied to a selected word line is represented by V1/Tox and an electric field Eox2 applied to the gate insulating film of the transistor of an unselected memory cell is represented by V2/Tox. Because these voltages V1 and V2 are different from each other, reliabilities in the voltages V1 and V2 are also different from each other. The reliability of a gate insulating film has been evaluated so far by mainly using the electric field Eox1 of the gate insulating film of the transistor of a memory cell connected to the word line. In the present invention, the actual reliability of the gate insulating film of the transistor of the unselected memory cell is also evaluated together, to determine the voltages HP and LP to be applied for on and off states, respectively.

Figure 3:
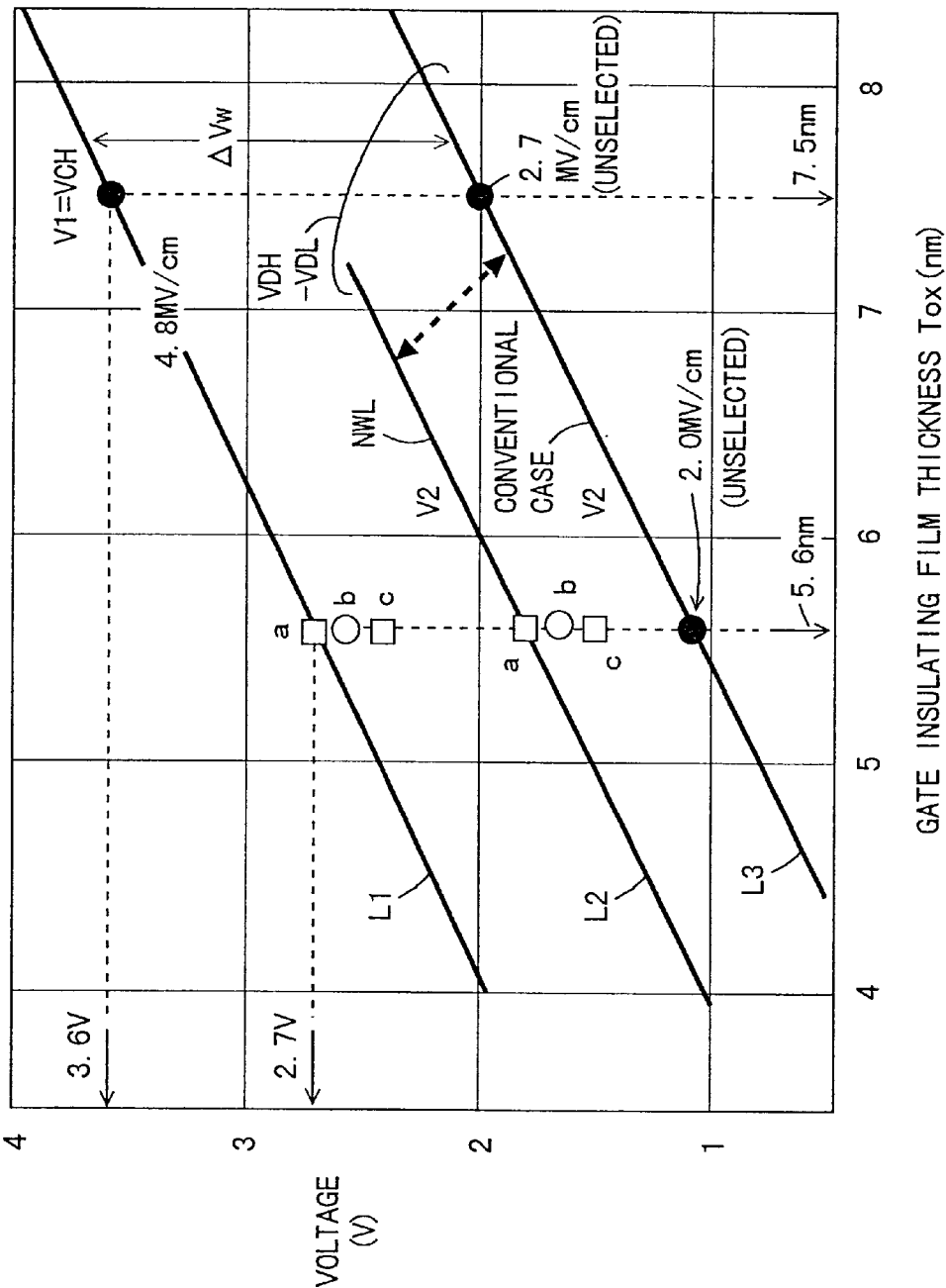
FIG. 3 is a diagram showing the gate insulating film thickness and the voltage value of each parameter in the NWL scheme.

FIG. 3 is a diagram showing the relation between gate insulating film thickness and voltages V1 and V2 for an NWL scheme memory transistor. In FIG. 3, a line L1 represents a selected word line voltage V1 (=VCH) of a conventional DRAM cell, a line L2 represents a bit line amplitude VDH–VDL in the NWL scheme, and a line L3 represents a bit line amplitude V2 of a conventional DRAM. The Y axis measures a voltage (unit: V) and the X axis measures a gate insulating film thickness Tox (unit: nm(nanometer)).

When the gate insulating film thickness Tox is equal to 7.5 nm and the bit line amplitude VDH−VDL is equal to 2 V, an electric field of 2V/7.5 nm=2.7MV/cm is applied to the gate insulating film of the memory transistor of an unselected memory cell. In the above state, because a voltage of 3.6 V is applied to the gate of the memory transistor of a selected memory cell, an electric field Eox applied to the gate insulating film becomes 4.8 Mv/cm. In the case of the NWL scheme, a bit line high level voltage VDH is set to a level higher than that of a conventional DRAM cell. Even if the voltage of a selected word line is set at the same level as that of the conventional DRAM cell, it is possible to lower the threshold voltage of a memory transistor and increase the bit line amplitude V2=VDH−VDL, as compared to a conventional case. Therefore, the line L2 representing the NWL scheme bit line amplitude VDH−VDL is obtained by translating the line L3 representing the bit line amplitude of a conventional DRAM cell upward.

Also in the NWL scheme, an applied electric field of the gate insulating film of a selected memory cell transistor is the same, which is represented by the line L1. Reliability almost the same as the reliability of the conventional DRAM cell is also assured for the NWL scheme memory transistor. As shown in FIG. 3, as the thickness of the gate insulating film decreases, it is necessary to further lower the voltage V2 of the bit line amplitude and the voltage V1 on the selected word line because it is necessary to assure the reliability of the gate insulating film. Upon application of a voltage higher than a voltage determined by the lines L1 and L2 each representing an applicable electric field of the gate insulating film, or upon application of a voltage lying above the lines L1 and L2, the reliability of the gate insulating film deteriorates and dielectric breakdown may more easily occur.

An applied electric field of the gate insulating film of the selected memory cell transistor is kept at 4.8 MV/cm. Therefore, when the gate insulating film has a thickness of 5.6 nm, a voltage to be applied to the gate becomes 2.7 V.

However, as described above, the electric field Eox1 of the gate insulating film of a selected memory cell transistor and the electric field Eox2 actually applied to the gate insulating film of an unselected memory cell transistor provide different reliabilities. Therefore, to assure the reliability of an unselected memory cell, a condition lying below values represented by the lines in FIG. 3, that is, a condition for a gate insulating film whose reliability is low is used. That is, an applied electric field of the gate insulating film of the memory transistor of an unselected cell is set to a level determined by a film condition whose reliability is lower than that of a selected memory transistor, and the applied electric field of the gate insulating film of the memory transistor of an unselected memory cell is made lower than an electric field applied when selected. Specifically, the value of the reliability factor Rel shown in FIG. 2, that is, a reliability evaluation value is reduced.

In general, in the case of a dynamic type semiconductor device (DRAM), a ratio of the number of selected word lines to the number of unselected word lines is approximately 1 to 2K–8K. The ratio between the number of selected word lines and the number of unselected word lines is assumed as SNW=(number of unselected word lines/number of selected word lines).

Moreover, taking into account the area of the edge portion in which a voltage is applied across the gate to source and drain portion of a memory cell transistor in a turned off state and the area of the gate insulating film of the memory transistor in a turned on state, a ratio between reliabilities of the edge portion of the gate to source/drain portion in the turn off state and the whole gate insulating film in the turned on state is assumed as β=(reliability of edge portion)/(reliability of entire surface of film) In this case, when the memory cell transistor is turned off (unselected state), no channel is formed. Therefore, a large electric field is applied to a region connected to the bit line in the memory transistor. Moreover, when H-level data is stored in a storage node, a large electric field is applied between a drain connected to the storage node and a gate (connected to unselected word line). Because a depletion layer expands in a channel, central region, a large electric field is not applied to the central region.

With the reliability factor Rel to improve the reliability of the gate insulating film of an unselected memory cell transistor, it is necessary to meet the following relational expression (1).

$$\text{Rel}(Eox1) \geq \text{Rel}(Eox2) \cdot \beta \cdot SNW \tag{1}$$

In the expression (1), the left side represents the reliability of the gate insulating film of a selected memory transistor and the right side represents the average reliability of an unselected memory transistor. Here, though the factor β is used as a parameter for reliability evaluation, the value of the reliability factor Rel increases when the reliability deteriorates. Therefore, the value of the parameter β0 is larger than 1.

When the above relational expression (1) is met, the state of the unselected memory cell transistor does not deteriorate the whole reliability. This is because the reliability of the transistor of the selected memory cell is assured by a burn-in test or the like and the reliability of the unselected memory cell is also assured. Specifically, the electric field applied to a gate of the unselected memory transistor is set lower than that of the selected memory transistor.

More specifically, in FIG. 2, the applied electric field of the gate insulating film of the memory transistor of an unselected memory cell is determined in accordance with the reliability factor curve A' represented by a broken line. In this case, the curve A' represents a reliability evaluation value of a film having a lower reliability than the gate insulating film reliability represented by the curve A. A condition in which a reliability evaluation value is equal to or lower than the reliability evaluation value of a selected memory cell is set along the curve A'. In FIG. 2, a condition corresponding to the point LP' providing a reliability evaluation value same as that of the selected memory cell is selected on the curve A'. At the point LP', the applied electric field Eox is for a low reliability film and is an electric field lower than the applied electric field at the point HP. In the above condition, an actual reliability (reliability evaluation value) corresponding to the point LP of the original curve A is obtained for an gate insulating film. That is, the reliability of the gate insulating film of the unselected memory cell becomes higher than that of the memory transistor of the selected memory cell. Thus, it is possible to avoid that the reliability of the unselected memory cell determines the whole reliability.

The reliability relation as described is related to an electric field applied to the gate insulating film of a memory transistor. Therefore, ranges for selecting the array power supply voltage Vcca, negative voltage VNN, high voltage VCH, and gate insulating film Tox are accordingly defined.

Now, conditions a, b, and c are specifically considered for a condition in which the thickness Tox of a gate insulating film is 5.6 nm. FIG. 4 shows values of the conditions a, b, and c. In the condition a, the array power supply voltage Vcca (=VDH) is set to 1.8 V, the high voltage VCH on a selected word line is set to 2.7 V, and the negative voltage VNL is set to −0.8 V. In this case, the electric field Eox1=VCH/Tox to be applied to the gate insulating film of a selected memory cell transistor is equal to 4.8 MV/cm, similarly to the case of a conventional DRAM cell. The electric field Eox2=(Vcca−VNN)/Tox actually applied to the gate insulating film of an unselected memory cell transistor is equal to approximately 4.6 MV/cm because the voltage of an unselected word line is equal to a negative voltage of −0.8 V and the high level voltage VDH of a bit line BL is equal to 1.8 V (=Vcca).

In the condition b, the high voltage VCH is set to 2.55 V, the array power supply voltage Vcca is set to 1.65 V, and the negative voltage VNN is set to −0.65 V. Also in this case, the thickness Tox of a gate insulating film is equal to 5.6 nm. In this state, the electric field Eox1 becomes 2.55 V/5.6 nm=4.6 MV/cm and the electric field Eox2 becomes 2.3 V/5.6 nm=4.1 MV/cm.

In the case of the condition c, the high voltage VCH is set to 2.4 V, the array power supply voltage Vcca is set to 1.5 V, and the negative voltage VNN is set to −0.5 V. In this state, the electric field Eox1 is equal to 2.4 V/5.6 nm=4.3 MV/cm and the electric field Eox2 is equal to 2.0 V/5.6 nm=3.6 MV/cm.

Therefore, in the case of the condition a, the electric fields Eox1 and Eox2 are almost equal to each other and the reliability of the memory transistor of the unselected memory cell would substantially determine the whole reliability. Therefore, the condition b or c is selected.

In FIG. 4, the gate insulating film thickness Tox may be sequentially decreased in accordance with a condition, to fix the gate electric field Eox1 of the memory transistor of the selected memory cell (selected memory cell transistor) to 4.8 MV/cm. For example, in the condition b in FIG. 4, when the thickness of a gate insulating film is set to 5.2 nm, the applied electric field Eox1 of the gate insulating film of the selected memory transistor becomes 4.8 MV/cm. In this case, the applied electric field Eox2 of the gate insulating film of the unselected memory transistor becomes 4.4 MV/cm.

When the condition that the maximum value of Eox1 is equal to or less than 5 MV/cm with respect to Eox1=VCH/Tox and Eox2=(VDH−VNN)/Tox is met, the reliability is substantially assured. Therefore, it is possible to decrease the thickness of the gate insulating film of a memory transistor, as compared to the case of the conventional mode without damaging reliability.

[Modification 1]

In the case of the foregoing configuration, the reliability of the gate insulating film at the gate edge portion of a memory transistor in a turned off state and the reliability of the whole of the gate insulating film are simply determined only by an area ratio. However, at the edge portion of the gate insulating film, etching is performed for patterning in the fabrication process and the reliability of the gate insulating film at the gate edge portion is deteriorated compared to the gate inside reliability due to a damage in etching (that is, a reliability evaluation value increases) depending on the processing method. Moreover, at the edge portion of the gate insulating film, a stress or the like is applied from a interlayer insulating film, and depending on the structure of the edge portion of the gate insulating film, a stress may become higher than that of the gate inside, and the reliability of the film deteriorates (that is, a reliability evaluation value increases). Therefore, with a factor γ (larger than 1 when the reliability of an internal film is assumed 1) representing the reliability deterioration due to a structural factor of the gate edge portion, the above expression (1) is represented by the following relational expression (2).

$$\mathrm{Rel}(\mathrm{Eox1}) \geq \mathrm{Rel}(\mathrm{Eox2}) \cdot \beta \cdot N \cdot \gamma \qquad (2)$$

Because the reliability of the gate edge portion is lower than that of the gate inside by approximately 1 to 100 times, the reliability of a gate insulating film deteriorates as the deterioration factor γ increases.

In the case described above, it is necessary to further lower the applied electric field Eox2 of the gate insulating film of an unselected memory transistor and the above condition c becomes the substantially optimum condition.

[Modification 2]

Figure 5:
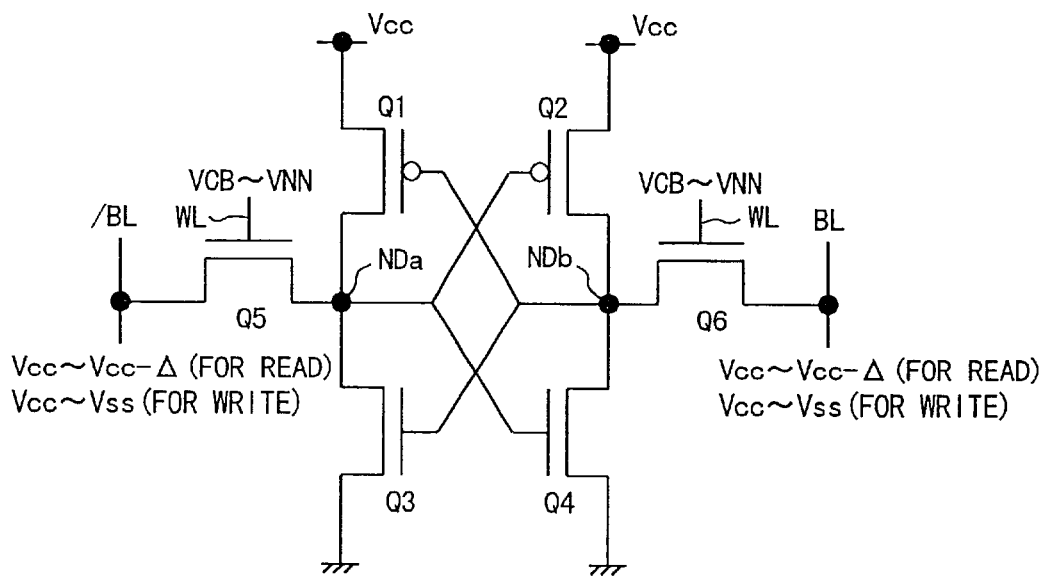
FIG. 5 is a diagram showing a configuration of a memory cell of a modification of the first embodiment of the present invention.

FIG. 5 is a diagram showing a configuration of a modification of the first embodiment of the present invention. FIG. 5 shows a memory cell of an SRAM (Static Random Access Memory). In FIG. 5, the SRAM cell includes: a P-channel MIS transistor Q1 which is connected between a power supply node and node NDa and whose gate is connected to a node NDb; a P-channel MIS transistor Q2 which is connected between the power supply node and the node NDb and whose gate is connected to the node Nda; an N-channel MIS transistor Q3 which is connected between the node Nda and a ground node and whose gate is connected to the nod NDb; an N-channel MIS transistor Q4 which is connected between the node NDb and the ground node and whose gate is connected to the nod NDa; an N-channel MIS transistor Q5 which electrically connects the node NDa to a bit line /BL in response to a signal potential on a word line WL; and an N-channel MOS transistor Q6 which connects the node NDb to a bit line BL in response to the signal potential on the word line WL.

In the case of the SRAM cell shown in FIG. 5, a voltage at a power supply voltage Vcc level is applied to the word line WL when selected, and a negative voltage VNN is applied to the word line WL when unselected. voltages of the bit lines BL and /BL are changed between voltages Vcc-Δ and Vcc by a not shown bit line load circuit when data is read. When data is written, operations of the bit line load circuit are inhibited and the power supply voltage Vcc and ground voltage Vss are applied to the bit lines BL and /BL in accordance with the write data.

Also in the case of the SRAM cell, the negative voltage VNN is applied to an unselected word line WL and a boost voltage VCB is applied to a selected word line WL. The boost voltage VCB is higher than the power supply voltage Vcc, and data write/read is performed at a high speed.

Therefore, also in the SRAM cell, a voltage VNN+Vcc is applied between the gate and the source or drain of the transfer gate in an unselected memory cell (MIS transistor Q5 or Q6), and the gate to source/drain voltage becomes almost equal to or high than the voltage VCB applied between the gate and the source or drain of the transfer gate in a selected memory cell. Thus, the reliability of the gate insulating film of the unselected memory cell becomes a major factor for the reliability of the whole SRAM. Therefore, also in the case of the SRAM cell, it is possible to prevent the reliability of the whole memory device from deteriorating by decreasing the reliability evaluation value of the gate insulating film of the unselected memory cell down to the reliability evaluation value of the gate insulating film of the selected memory cell or less as shown in FIG. 2, or by making the gate insulating film applied electric field of the transfer gate of the unselected memory cell smaller than that of the transfer gate of the selected memory cell.

As described above, according to the first embodiment of the present invention, the reliability evaluation value of the gate insulating film of a transistor to be turned off in an unselected memory cell is made equal to or smaller than the reliability evaluation value of the gate insulating film of a transistor to be turned on in a selected memory cell in the memory cells of the negative voltage word line scheme, it is possible to prevent the reliability of a gate insulating film from deteriorating due to increase of the gate insulating film applied electric field of the unselected memory cell.

[Second Embodiment]

Figure 6:
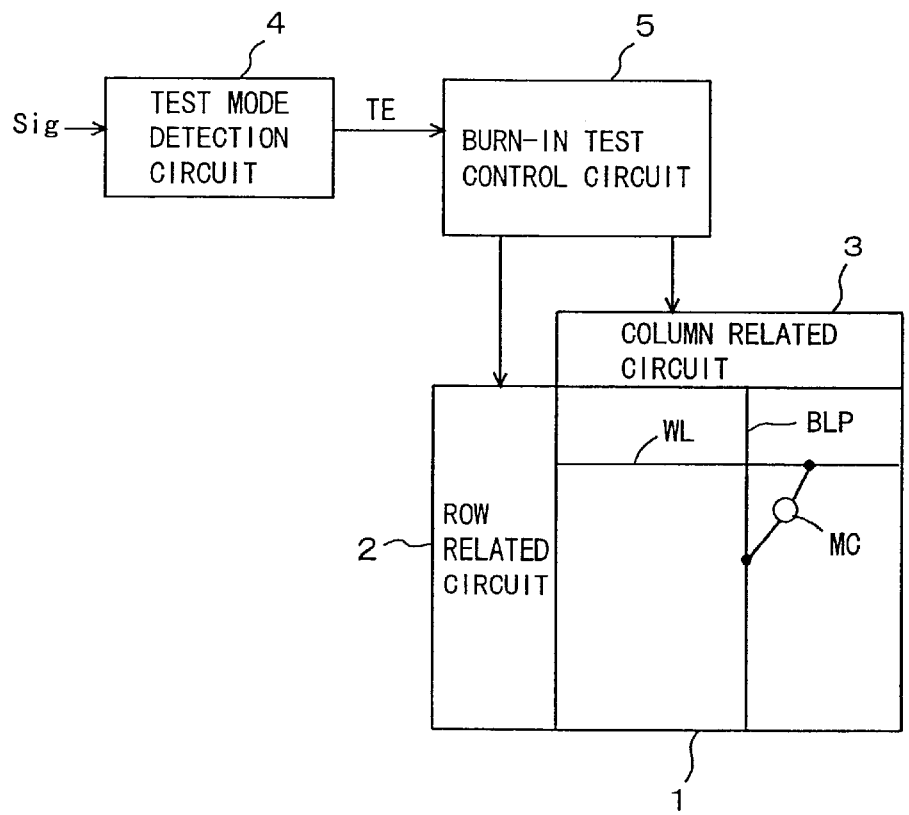
FIG. 6 is a diagram schematically showing a configuration of a main portion of a semiconductor device of the present invention.

FIG. 6 is a diagram schematically showing a configuration of a main portion of the semiconductor memory according to the second embodiment of the present invention. In FIG. 6, the semiconductor memory includes a memory array 1 having memory cells MC arranged in rows and columns. The memory array 1 includes word lines WL arranged corresponding to the rows of the memory cells MC and bit line pairs BLP arranged corresponding to the columns of the memory cells MC. Each bit line pair BLP includes complementary bit lines BL and /BL. When the semiconductor memory device is a DRAM, a memory cell MC is placed corresponding to the intersection between either of the complementary bit lines BL and /BL and word line WL. When the semiconductor memory is an SRAM, a memory cell MC is placed at the intersection between bit lines BL and /BL and the word line The semiconductor memory further includes a row related circuit 2 for selecting an addressed row of the memory array 1 and a column related circuit 3 for selecting an addressed column of the memory array 1. The row related circuit 2 includes a row address input buffer, a row address decoder, a word line drive circuit, a sense amplifier circuit, and a bit line precharge/equalize circuit. The column related circuit 3 includes a column address input buffer and a column decoder.

The semiconductor memory further includes a test mode detection circuit 4 for detecting whether a burn-in test is designated in accordance with an external signal Sig and a burn-in test control circuit 5 for generating a voltage and a control signal necessary for burn-in in accordance with a burn-in mode detection signal TE received from the test mode detection circuit 4. A plurality of word lines is simultaneously selected and the voltage level of the bit line pair BLP is set by the burn-in test control circuit 5. Voltage acceleration (voltage boosting) of the word line WL and bit line pair BLP can be realized by using a conventional burn-in test control circuit. By using the conventional burn-in test control circuit for accelerating the voltage of a selected memory cell, burn-in of an unselected memory cell is also executed. The burn-in sequence is described below.

Figure 7A:
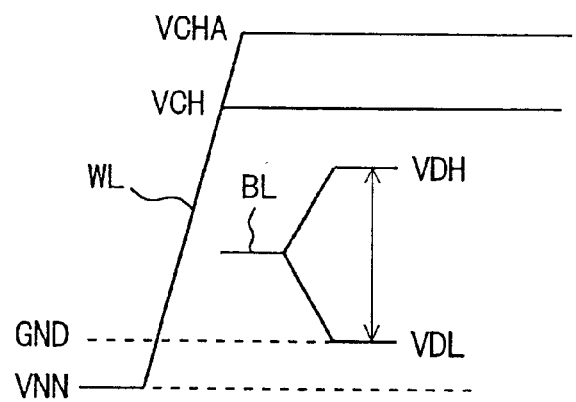
FIGS. 7A to 7C are diagrams showing basic operation modes of the burn-in operation mode according to a second embodiment of the present invention.
Figure 7B:
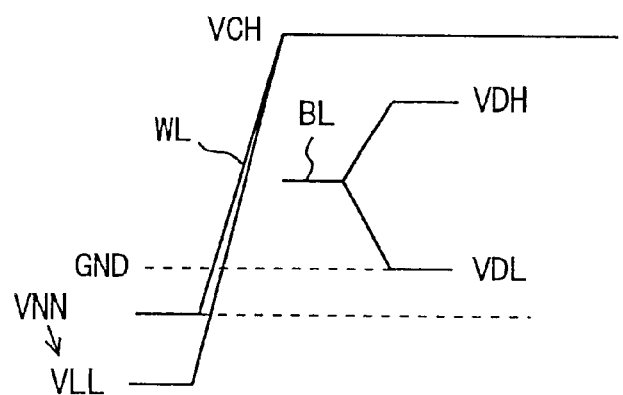
Figure 7C:
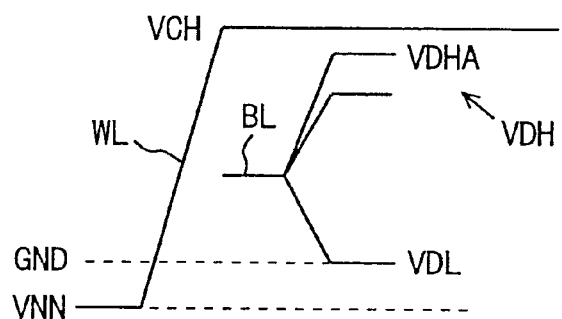

FIGS. 7A to 7C are diagrams representing the voltage application sequence in the burn-in test in the second embodiment of the present invention. Referring to FIG. 7A, in the case of the first burn-in mode operation, a selected word line voltage is boosted up to a boosted voltage VCHA in order to accelerate the voltage VCH of the selected word line. The acceleration method represented in FIG. 7A is the same as a conventional one, in which the voltage of a selected word line is accelerated to execute burn-in of the selected word line. However, voltages VDH and VDL of bit lines are not accelerated.

In the case of the burn-in mode operation represented in FIG. 7B, the voltage VLL of an unselected word line is accelerated and set to a negative voltage VLL. That is, the gate bias of an unselected memory transistor (memory transistor of DRAM or transfer gate of SRAM) is deepened. Therefore, in the burn-in mode operation represented in FIG. 7B, unselected memory cells are screened. However, neither bit line voltage VDH nor bit line voltage VDL is accelerated.

Referring to FIG. 7C, in the case of the third burn-in mode operation, neither voltage VCH of the selected word line nor voltage VNN of unselected word line is accelerated. The high level voltage VDH out of the bit line voltages VDL and VDH is accelerated and set to a voltage VDHA. Thereby, the voltage stress between the gate and source of an unselected memory cell transistor is accelerated.

A burn-in test is executed with the burn-in mode operations represented in FIGS. 7A to 7C being a basic operation. Therefore, the total of seven types of burn-in (voltage acceleration) operation modes are realized. Among these operation modes, the first burn-in mode operation represented in FIG. 7A is the same as the conventional operation. Therefore, it is possible to perform the total of six types of burn-in (stress accelerations) on unselected memory cell transistors. Combinations of the burn-in operations are A, B, C, AB, AC, BC, and ABC. In this case, "A", "B", and "C" indicate the burn-in mode operations represented in FIGS. 7A to 7C, respectively. "A" is the burn-in operation of a selected memory cell, and is the same as the conventional one. By appropriately combining these operations, the voltage stress of an unselected memory cell transistor is accelerated.

In this case, it is possible to perform a burn-in test of an unselected memory cell transistor by using the test control method same as the conventional one, only with a configuration for accelerating a bit line voltage and an unselected word line voltage utilized.

As described above, according to the second embodiment, acceleration of voltages of selected and unselected word lines and acceleration of a high level voltage of a bit line (voltages of bit line pair are simultaneously accelerated) are utilized as the basic operations and are suitably combined, to perform burn-in. Therefore, it is possible to easily screen gate insulating films of selected and unselected memory cells of a semiconductor memory of the negative voltage word line scheme and improve the reliability of the semiconductor memory.

[Third Embodiment]

Figure 8:
FIG. 8 is a diagram showing the relation between the gate insulating film thickness and the voltage of each parameter of a BSG scheme semiconductor memory of a third embodiment of the present invention.

FIG. 8 is a diagram showing the relation between the gate insulating film thickness and the voltage of a memory transistor of a BSG scheme DRAM. In FIG. 8, voltages V1 and V2 are used as parameters for the BSG scheme memory transistor. The voltage V2 for the BSG scheme memory transistor measures a bit line amplitude, and is a voltage VDH−VDL equal to Vcca−Vbsg. The conventional gate voltage V2 of an unselected memory transistor is equal to a bit line amplitude and is equal to the array power supply voltage Vcca.

However, the voltage V1 serving as a parameter for a selected memory transistor is measured on the basis of the low-level voltage VDL of a bit line and equal to a voltage VCH−VDL. In this case, a gate insulating film thickness Tox and a word line voltage are determined such that the same gate insulating film applied voltage of 4.8 MV/cm is applied to a selected memory cell in both the BSG scheme and the conventional type. In the case of the line L1, the gate insulating film applied voltage of a selected memory cell transistor in a BSG scheme becomes equal to VCH−Vbsg. In the case of a conventional DRAM cell, the line L1 measures the high voltage VCH.

Therefore, also in the case of the BSG scheme, the reliability of a gate insulating film is evaluated in accordance with the difference between a voltage on a selected word line and a low-level voltage of a bit line for a selected memory cell, similarly to the conventional case. Also in the case of the BSG scheme, a gate insulating film applied electric field represented by the following expression is present as a parameter.

(VCH−VDL)/Tox: Applied electric field of gate insulating film of selected memory cell transistor,
(VDH−VDL)/Tox: Applied electric field of gate insulating film of unselected memory cell transistor.

Conventionally, the reliability of a gate insulating film is evaluated in accordance with these parameters. However, the electric fields Eox1 and Eox2 actually applied to a gate insulating film are different in value from these parameters. Also in the case of a BSG scheme DRAM, the access operation on a memory cell is the same as in the above NWL scheme DRAM. Therefore, it is necessary to have the same relation as the above expression (1) hold. Each voltage and gate insulating film thickness are determined such that the electric fields Eox1 and Eox2 take a value of 5 MV/cm or less and the actual applied electric field of the gate insulating film of the memory transistor of an unselected memory cell becomes lower than that of the memory transistor of a selected memory cell. That is, the reliability evaluation value of the gate insulating film of the transistor of the unselected memory cell (unselected memory transistor) is made lower than the reliability evaluation value of the gate insulating film of the transistor of the selected memory cell (selected memory transistor).

FIG. 9 is a diagram showing specific numerical values in the conditions d to f shown in FIG. 8. The thickness Tox of the gate insulating film of a memory transistor is set equal to 5.6 nm. In the condition d, the voltage VCH on a selected word line is equal to 2.7 V, the high-level voltage VDH on a bit line is equal to the array power supply voltage Vcca of 1.8 V, and the low-level voltage Vbsg of a bit line is equal to 0 V. In this case, the boosted sense ground voltage Vbsg is not boosted similarly to the conventional case. The gate insulating film applied electric field Eox1 of a selected memory cell transistor is equal to 2.7/5.6=4.8 MV/cm while the gate insulating film applied electric field Eox2 of an unselected memory cell transistor is equal to 1.8/5.6=3.2 MV/cm.

In the case of the condition e, voltages VCH, VDH, and VDL (=Vbsg) are set to 2.7 V, 1.8 V, and 0.3 V. The gate insulating film applied electric field Eox1=(VCH−VDL)/Tox of the selected memory transistor is equal to 2.4/5.6=4.3 MV/cm. An unselected word line is kept at the ground voltage level and the gate insulating film applied electric field Eox2=VDH/Tox of the unselected memory transistor is equal to 1.8/5.6=3.2 MV/cm.

In the case of the condition f, voltages VCH, VOH, and VDL are equal to 2.7 V, 1.8 V, and 0.5 V, respectively. The gate insulating film applied electric field Eox1 of the selected memory cell transistor is equal to 2.2/5.6=3.9 MV/cm. However, the gate insulating film applied electric field Eox2 of the unselected memory transistor is 3.2 MV/cm unchangedly.

In the case of the condition f, the difference between the gate insulating film applied electric fields Eox1 and Eox2 is small, and in the case of the BSG scheme, the condition e in which the difference between the electric fields Eox1 and Eox2 is largest is substantially optimal. Therefore, each voltage and gate insulating film thickness are determined in accordance with the condition e. The conditions e and f correspond to a condition for the case in which the reliability of a gate insulating film is lower than the reliabilities of gate insulating films represented by the lines L1 and L2.

Also in the case of the BSG scheme, when the reliability of the gate insulating film at a gate edge portion deteriorates and the reliability deterioration factor γ is present, the above expression (1) is represented by the expression (2) similarly to the case of the first embodiment. Therefore, when the reliability deterioration factor γ is present, it is necessary to further lower the gate insulating film applied electric field Eox2 compared to the gate insulating film applied electric field Eox1. Therefore, the condition e becomes an optimal condition also in this case.

Moreover, the gate insulating films Tox may be appropriately combined to obtain the reliability of a selected memory cell and the reliability of an unselected memory cell in accordance with the parameters shown by the lines in FIG. 8.

[Fourth Embodiment]

Figure 10A:
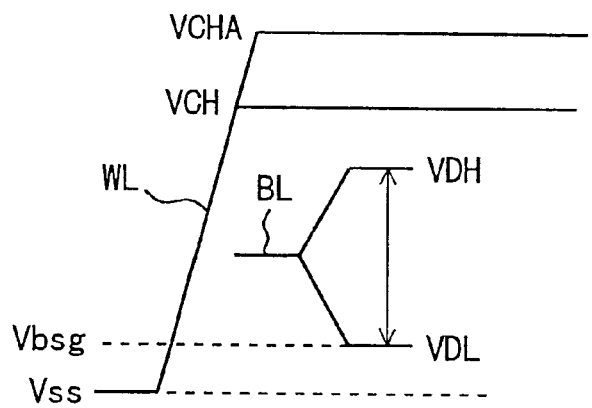
FIGS. 10A to 10C are diagrams showing basic modes of the burn-in operation mode of a semiconductor memory of the third embodiment of the present invention.
Figure 10B:
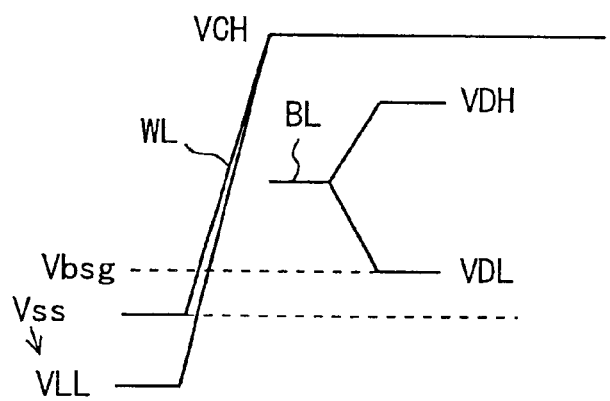
Figure 10C:
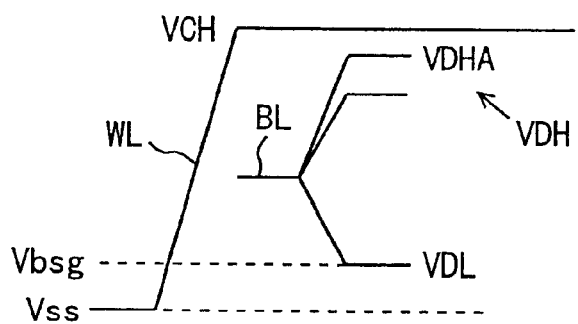

FIGS. 10A to 10C are diagrams showing applied voltages in burn-in operations of a BSG scheme memory according to the fourth embodiment of the present invention. In FIGS. 10A to 10C, three basic burn-in mode operations are shown. By appropriately combining these three basic burn-in mode operations, an actual burn-in test of a BSG scheme memory cell is performed.

Referring to FIG. 10A, in the first burn-in mode operation, a voltage VCH is accelerated to be transferred onto a selected word line for setting the selected word line to an accelerated voltage VCHA. However, neither bit line voltage VDH nor bit line voltage VDL is accelerated. Moreover, an unselected word line is kept at the ground voltage Vss. In the case of this operation mode, the voltage stress of a selected memory cell is accelerated.

Referring to FIG. 10B, in the second burn-in mode operation, the voltage of an unselected word line is accelerated from the ground voltage Vss to the negative voltage VLL. In the case of this operation mode, burn-in of the gate insulating film of the memory transistor of an unselected memory cell is performed. However, neither voltage VDH nor VDL of a bit line BL is accelerated.

Referring to FIG. 10C, in the third burn-in mode operation, the high-level voltage VDH (=Vcca) of a bit line is accelerated and set to a boosted voltage VDHA. However, the voltage of a word line WL is not accelerated. In this case, the voltage stress of the gate insulating film of the transistor of an unselected memory cell is accelerated. By combining the burn-in mode operations represented in FIGS. 10A to 10C, the voltage of an unselected word line WL is accelerated and set to the voltage VLL. Moreover, as shown in FIG. 10C, the bit line high-level voltage VDH is accelerated to the boosted voltage VDHA. Thus, it is possible to further accelerate the voltage stress of the gate insulating film of the transistor of the unselected memory cell.

To apply a boosted voltage to each bit line, a sense amplifier may be held in the inactive state in the burn-in test mode for applying a boosted voltage to each bit line through a bit line precharge/equalize circuit if the semiconductor memory is DRAM. Alternatively, an array power supply voltage may be accelerated to be applied to a bit line through a sense amplifier circuit. Any method can be used for bit line voltage acceleration.

Moreover, by combining all the burn-in mode operations represented in FIGS. 10A to 10C, it is possible to accelerate the voltages of both selected and unselected word lines, to accelerate the voltages actually used for more effectively executing a burn-in test.

It is possible to use the circuit configuration shown in FIG. 6 as a circuit configuration for realizing the burn-in operations represented in FIGS. 10A to 10C.

As described above, according to the fourth embodiment of the present invention, a BSG scheme semiconductor memory is constituted so as to accelerate the voltage of an unselected word line and the high-level voltage of a bit line. Therefore, by adding these operations to normal acceleration of the word line voltage of a selected memory cell, it is possible to easily perform the burn-in of the transistor of an unselected memory cell, using a conventional burn-in test control circuit.

[Fifth Embodiment]

Figure 11:
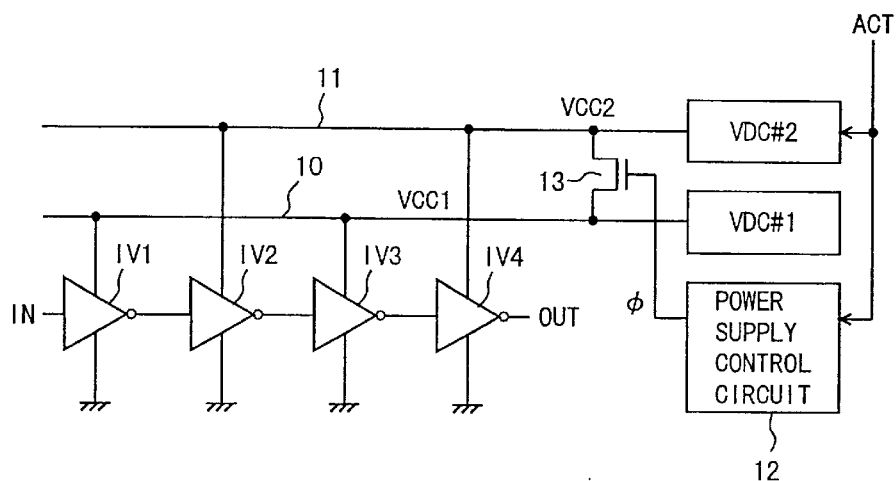
FIG. 11 is a diagram schematically showing a configuration of a semiconductor device according to a fifth embodiment of the present invention.

FIG. 11 is a diagram schematically showing the configuration of a main portion of a semiconductor device according to the fifth embodiment of the present invention. In FIG. 11, the semiconductor device may be a peripheral circuit of a semiconductor memory or a general semiconductor integrated circuit, and is merely required to have an active state and a standby state.

Referring to FIG. 11, there are arranged internal power supply circuits VDC#1 and VDC#2 for generating internal power supply voltages VCC1 and VCC2, power supply lines 10 and 11 for transferring the internal power supply voltages VCC1 and VCC2 supplied from the internal power supply circuits VDC#1 and VDC#2, a power supply control circuit 12 for generating a switching control signal $\phi$ in accordance with an active designation signal ACT, and a power supply transistor 13 for selectively connecting the power supply lines 10 and 11 in response to the switching control signal $\phi$. The standby state and active state of an internal circuit are designated by the active designation signal ACT. The internal power supply circuit VDC#1 generates the internal power supply voltage VCC1 at a constant voltage level independently of the logic state of the active designation signal ACT. The internal power supply circuit VDC#2 generates the internal power supply voltage VCC2 at the same voltage level as the voltage VCC1 generated by the internal power supply circuit VDC#1 when the active designation signal ACT is kept in the active state and generates the voltage VCC2 at the level higher than the power supply voltage VCC1 when the active designation signal ACT is kept in the standby state. The power supply transistor 13 is turned off in the standby state, and is turned on in the active state. In this case, the standby state may be a standby cycle in a normal operation mode or a sleep mode in which processing is not performed for a long time.

An inverter chain constituted of CMOS inverter circuits IV1 to IV4 constituting the internal circuit is provided for the power supply lines 10 and 11. An input signal IN is supplied to the inverter chain. The input signal IN is set to a high level in the standby state. The inverter circuits IV1 and IV3 at odd-numbered stages are connected to the power supply line 10 and the inverter circuits IV2 and IV4 at even-numbered stages are connected to the power supply line 11. The input signal IN is generated by a circuit for receiving the voltage VCC2 on the power supply line 11 as an operating power supply voltage and therefore, the high level of the input signal IN is equal to the level of the voltage VCC2.

Figure 12:
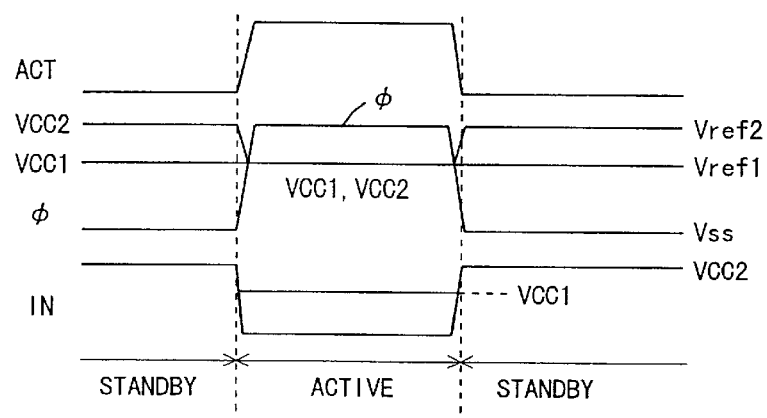
FIG. 12 is a signal waveform diagram representing operations of the semiconductor device in FIG. 11.

Now, operations of the semiconductor device shown in FIG. 11 are described below, referring to the signal waveform diagram shown in FIG. 12. In the standby state, the input signal IN is kept at H level of the voltage VCC2 level and the voltage VCC2 is kept at the level of a reference voltage Vref2. The power supply voltage VCC1 is kept at the level of a reference voltage Vref1 and the power supply voltage VCC2 is kept at a voltage level higher than the power supply voltage VCC1. The power supply transistor 13 is constituted of an N-channel MOS transistor and is kept in the off state since the switching control signal $\phi$ is kept at the ground voltage level. The input signal IN is kept at the level of the voltage VCC2 and the gate to source of the P-channel MOS transistor to be turned off in the inverter circuit IV1 is brought into a deep reverse bias state to reduce a sub-threshold current. P-channel MIS transistors to be turned off in the inverter circuits IV1 to IV4 are brought into a deeper off state and it is possible to reduce a sub-threshold current.

In the active state, the switching control signal $\phi$ becomes H-level of the reference voltage Vref2 level, the power supply transistor 13 is turned on, and the power supply lines 10 and 11 are electrically connected together. The internal power supply circuit VDC#2 generates the internal power supply voltage VCC2 of the level of the reference voltage Vref1. Thus, the internal power supply voltages VCC1 and VCC2 at the level of the reference voltage Vref1 are generated on the power supply lines 10 and 11, and the inverter circuits IV1 to IV4 are operated by internal power supply voltages of the same voltage level.

In this arrangement, an N-channel MIS transistor is used as the power supply transistor 13 because of the following reason.

Figure 13A:
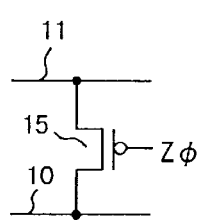
FIG. 13A is a modification of the power supply transistor in FIG. 11
Figure 13B:
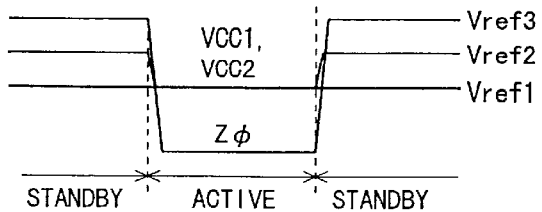
FIG. 13B is a signal waveform diagram representing operations of the modification.

It is considered to use a P-channel MIS transistor as the power supply transistor 15 as shown in FIG. 13A. In this case, it is necessary to turn off the power supply control transistor 15 in the standby state. Therefore, it is necessary to set a switching control signal Z$\phi$ to the level of a reference voltage Vref3 higher than the reference voltage Vref2 for the following reason. When the switching control signal Z$\phi$ is set to the level of the reference voltage Vref2, a sub-threshold leak current flows to the power supply line 10 from the power supply line 11 through the power supply transistor 15 and current consumption increases. In this case, when the operation state transits from the standby state to the active state as shown in FIG. 13B, it is necessary to lower the switching control signal Z$\phi$ from the level of the reference voltage Vref3 down to the ground voltage level, and it takes time to switch the voltage levels of the switching control signal.

When the N-channel MOS transistor 13 is used as a power supply transistor, the voltage change range of the gate of the transistor 13 is kept at the level of the reference voltage Vref2 and is small. Therefore, it is possible to perform switching at a high speed. Moreover, because it is only required for the power supply transistor 13 to equalize the voltage of the power supply line 10 with that of the power supply line 11 in an active cycle (state). Therefore, it is enough that the switching control signal $\phi$ is raised by the threshold voltage of the MIS transistor 13 above the reference voltage Vref1. Because of these factors, the N-channel MIS transistor is used as the power supply transistor 13.

However, when a P-channel MIS transistor is used as the power supply transistor 15 as shown in FIG. 13A, the gate to source/drain voltage in the active state becomes higher than the voltage applied in the standby state. Thus, it is necessary to determine the reliability of the power supply transistor in accordance with the reliability of the gate insulating film in the on state.

As shown in FIG. 11, when the N-channel MIS transistor is used as the power supply transistor 13, the gate to drain voltage of the power transistor 13 in the standby state becomes higher than that in the active state. That is, the gate to drain voltage is equal to VCC2 in the standby state while the gate to drain voltage is equal to (VCC2−VCC1). That is, the gate insulating film applied electric field Eox of the power supply transistor 13 in the standby state becomes higher than that in the active state. Therefore, it is necessary to completely assure the reliability of the gate insulating film of the power supply transistor 13 in the standby state and to execute a burn-in test in the standby state.

When a P-channel MIS transistor is used for the power supply transistor 15 as shown in FIG. 13A, it is possible to assure the insulating characteristic of the power supply transistor through the burn-in test in the active state, because the gate insulating film applied electric field Eox (active) in the active state is larger than the gate insulating film applied electric field Eox (standby) in the standby state.

Figure 14:
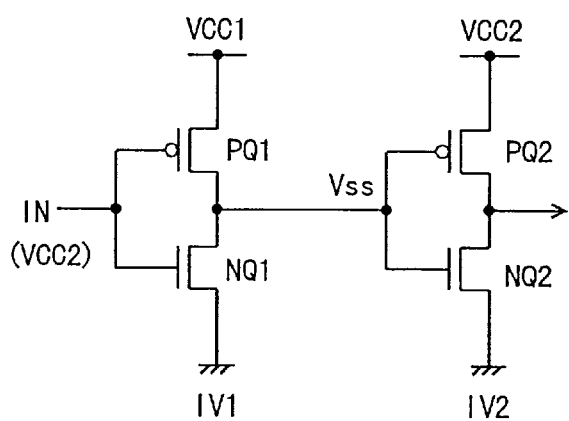
FIG. 14 is a diagram showing a configuration of the inverter circuit in FIG. 11.

FIG. 14 is a diagram showing configurations of the inverter circuits IV1 and IV2 of two stages shown in FIG. 11 and an applied voltage in the standby state. In FIG. 14, the inverter circuit IV1 includes a P-channel MIS transistor PQ1 and an N-channel MIS transistor NQ1 and the inverter circuit IV2 includes a P-channel MIS transistor PQ2 and an N-channel MIS transistor NQ2. An input signal IN is supplied to gates of the MIS transistors PQ1 and NQ1. An output signal of the inverter circuit IV1 is supplied to gates of the MIS transistors PQ2 and NQ2.

In the standby state, the input signal IN is kept at the voltage VCC2 level, that is, the level of the reference voltage Vref2. The inverter circuit IV1 receives the power supply voltage VCC1. Therefore, the gate to source of the P-channel MIS transistor PQ1 is brought into a deep reverse biased state in the standby state and a sub-threshold current is suppressed. In inverter circuit IV2, the ground voltage Vss is supplied to the gate of the P-channel MIS transistor PQ2 in the standby state. In each of these MIS transistors NQ1 and PQ2, the absolute value of the voltage between the gate and source is equal to VCC2 in the standby state.

However, in the active state, the input signal IN reaches the power supply voltage VCC1 level because VCC1 becomes equal to VCC2. When the input signal IN is kept at H-level in the active state, the absolute value of the voltage between the gate and source of each of the MIS transistors NQ1 and PQ2 becomes equal to VCC1 (=Vref1). That is, as to each of the MIS transistors NQ1 and PQ2, the gate insulating film applied electric field Eox (standby) in the standby state becomes higher than the gate insulating film applied electric field Eox (active) in the active state. Therefore, it is necessary to set the gate insulating film thickness Tox of each of the MIS transistors NQ1 and PQ2 and the level of the reference voltage Vref2 determining the voltage level of the power supply voltage VCC2 in the standby so as to completely assure the reliability thereof. That is, it is necessary to set the level of the power supply voltage VCC2 so as to meet at least the condition of VCC2/Tox<5 MV/cm.

Also in the above case, it is necessary to meet the following relational expression (3) similarly to the case of the first and third embodiments.

$$\mathrm{Rel}(\mathrm{Eox}(\mathrm{active})) \geq \mathrm{Rel}(\mathrm{Eox}(\mathrm{standby})) \cdot \beta \cdot N \quad (3)$$

In the above expression, N denotes the ratio between active state time period and standby state time period of the semiconductor device and therefore, N is equal to (standby state time period)/(active state time period). The reliability factor Rel is the same as that shown in FIG. 2, which represents a low reliability state when the value of the reliability factor Rel, that is, a reliability evaluation value is high.

According to this condition, ranges for selecting the power supply voltages VCC1 and VCC2 and the gate insulating film thickness Tox are defined.

Moreover, when the oxide film reliability of the gate edge portion is deteriorated and it becomes necessary to consider the reliability deterioration factor γ of the gate edge portion of the power supply transistor 13, the above expression (3) is modified to the following expression (4).

$$\mathrm{Rel}(\mathrm{Eox}(\mathrm{active})) \geq \mathrm{Rel}(\mathrm{Eox}(\mathrm{standby})) \cdot \beta \cdot N \cdot \gamma \quad (4)$$

In this case, for the gate insulating film applied electric field of each of the MIS transistors NQ1 and PQ2, the gate insulating film applied electric field Eox(standby) in the standby state is equal to VCC2/Tox, and the maximum gate insulating film applied electric field Eox (active) in the active state is equal to VCC1/Tox. It is similarly necessary to assure the reliability of the gate insulating film of each of these MIS transistors NQ1 and PQ1 in accordance with the above expressions (3) and (4). These expressions (3) and (4) are similarly applied to the power supply transistor 13.

[Burn-in Operation]

The burn-in method of the semiconductor device shown in FIG. 11 is described below, referring to FIGS. 15 and 16.

Figure 15:
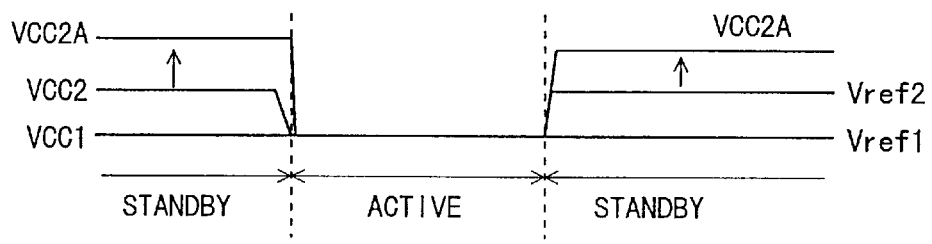
FIG. 15 is a diagram showing a voltage waveform in the first burn-in operation mode of the semiconductor device in FIG. 11.

First, in the first burn-in mode, the power supply voltage VCC2 generated by the internal power supply circuit VDC#2 is accelerated and an accelerated voltage VCC2A is generated and transferred to the internal power supply line 11 as shown in FIG. 15. In contrast, the voltage VCC1 of the internal power supply circuit VDC#1 keeps the level of the reference voltage Vref1. In this case, it is possible to accelerate the voltage stress of the gate insulating film of an MIS transistor whose gate insulating film applied electric field increases in the standby state relative to that in the active state. Therefore, it is also possible to accelerate the voltage stress of the gate insulating film of the power supply transistor 13 shown in FIG. 11 and to accelerate the voltage stress of the gate insulating film of each of the MIS transistors NQ1 and PQ2 shown in FIG. 14. Thus, the reliability of a gate insulating film is assured in the standby state longer than the active-state time.

Figure 16:
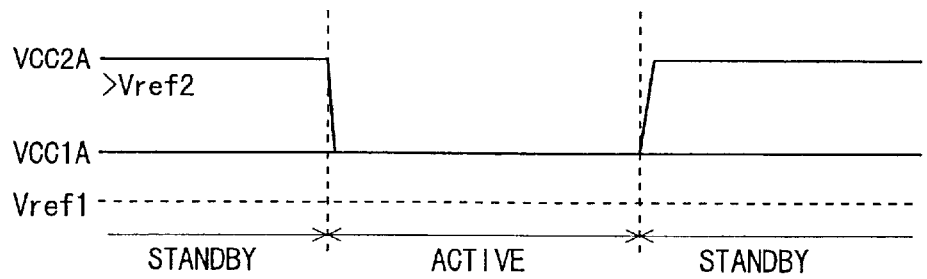
FIG. 16 is a diagram showing a voltage waveform in the second burn-in operation mode of the semiconductor device in FIG. 11.

FIG. 16 is a diagram representing the second burn-in operation mode. In the second burn-in operation mode represented in FIG. 16, the power supply voltages VCC1 and VCC2 are set to the accelerated voltages VCC1A and VCC2A. In the standby state, voltage stresses of gate insulating films of all MIS transistors are accelerated. Thus, it is possible to securely accelerate the voltage stress of the gate insulating film of an MIS transistor.

It is enough that the internal power supply circuit VDC#2 includes a comparison circuit for selecting either of the reference voltages Vref1 and Vref2 in accordance with an active designation signal ACT and comparing a selected reference voltage with the voltage of the internal power supply line 11 and a circuit for flowing a current to the power supply line 11 from an external power supply node in accordance with an output signal of the comparison circuit.

[Modification]

Figure 17:
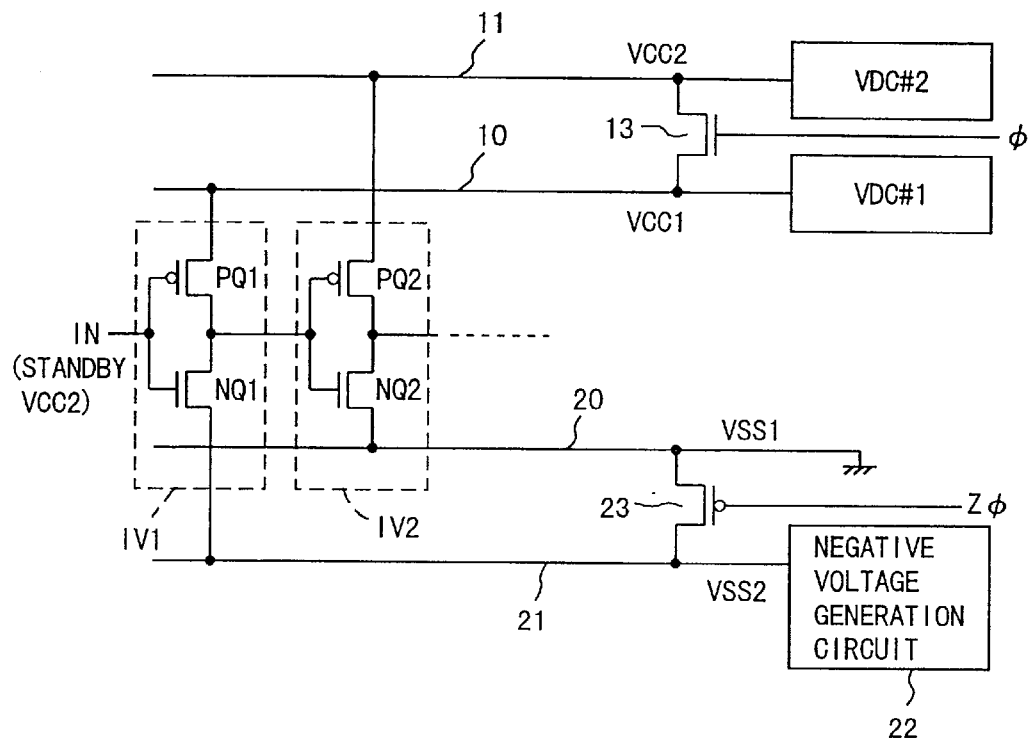
FIG. 17 is a diagram schematically showing a configuration of a modification of the semiconductor device of the fifth embodiment of the present invention.

FIG. 17 is a diagram schematically showing a configuration of a modification of the fifth embodiment of the present invention. In FIG. 17, similarly to the case of the configuration shown in FIG. 11, power supply lines 10 and 11 are used to transfer power supply voltages VCC1 and VCC2 from internal power supply circuits VDC#1 and VDC#2. A power supply transistor 13 to be selectively turned on in response to a switching control signal φ is provided between the power supply lines 10 and 11.

Further, referring to FIG. 17, there is provided low-level power supply lines 20 and 21. The low-level power supply line 20 transfers, for example, a ground voltage VSS1. The low-level power supply line 21 transfers a negative voltage VSS2 supplied from a negative voltage generation circuit 22. A power supply transistor 23 constituted of a P-channel MIS transistor and selectively turned on in response to a switching control signal Zφ is provided between the low-level power supply lines 20 and 21. The switching control signals φ and Zφ are signals complementary each other.

Though a string of inverters IV1, IV2, . . . is arranged, inverter circuits IV1 and IV2 are representatively shown in FIG. 17. In the inverter circuit IV1, the source of an MIS transistor PQ1 is connected to the power supply line 10 and the source of an MIS transistor NQ1 is connected to the low-level power supply line 21. In the inverter circuit IV2, the source of an MIS transistor PQ2 is connected to the power supply line 11 and the source of an MIS transistor NQ2 is connected to the low-level power supply line 20. Subsequently, the source node of the MIS transistor of an inverter circuit is alternately connected to the power supply lines 10 and 11 and to the low-level power supply lines 20 and 21. The negative voltage generation circuit 22 generates a negative voltage VSS2 in the standby state and generates a ground voltage VSS1 in the active state (stops generation of a negative voltage).

The internal power supply circuits VDC#1 and VDC#2 generate power supply voltages VCC1 and VCC2, similar to the configuration shown in FIG. 11. An input signal IN is kept at the level of the voltage VCC2 in the standby state. Therefore, the MIS transistors PQ1 and NQ2 are turned off. The gate of the MIS transistor PQ1 is brought into a reverse biased state and a sub-threshold current is reduced. The negative voltage VSS2 is transferred to gates of the MIS transistors PQ2 and NQ2 of the inverter circuit IV2 through the MIS transistor NQ1. Also in the MIS transistor NQ2, the gate to source is brought into a reverse biased state and a sub-threshold current is reduced.

Therefore, in a hierarchical power supply configuration as shown in FIG. 17, it is possible to reliably suppress the sub-threshold leak current of an MIS transistor turned off in the inverter circuits IV1, IV2, . . . by bringing the gate to source of the MIS transistor into a reverse biased state.

However, in the above configuration, a voltage higher than that in the configuration shown in FIG. 11 is applied to the gate insulating film of each of the MIS transistors NQ1 and PQ2.

Figure 18:
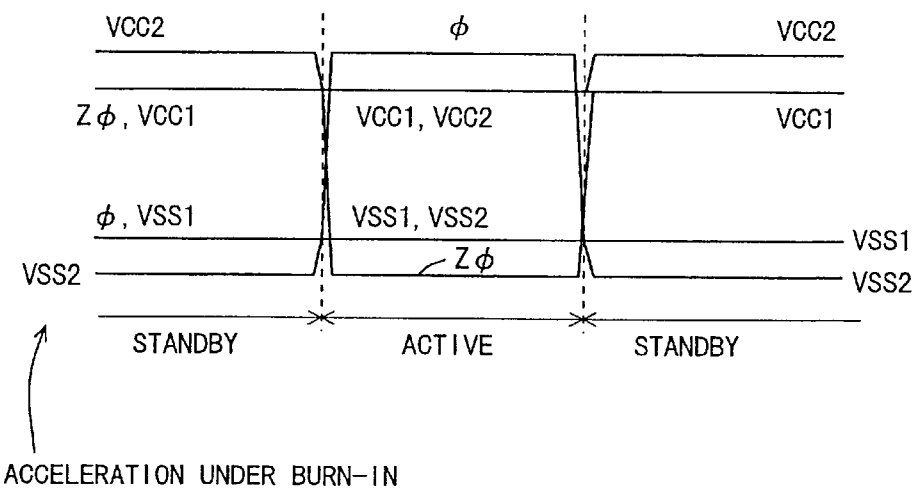
FIG. 18 is a signal waveform diagram representing operations of the semiconductor device in FIG. 17.

FIG. 18 is a signal waveform diagram representing operations of the circuit shown in FIG. 17. The switching control signal φ is kept at the level of the ground voltage VSS1 in the standby state and the switching control signal Zφ is kept at the level of the power supply voltage VCC1. Moreover, the power supply voltage VCC2 is kept at a level higher than that of the voltage VCC1 in the standby state and the negative voltage VSS2 is kept at a level lower than that of the ground voltage VSS1.

In the active state, the switching control signal φ is set to the level of the voltage VCC2 (Vref2) and the switching control signal Zφ is set to the level of the negative voltage VSS2. A voltage higher than that in the active state is applied to the gate insulating film of each of the power supply transistors 13 and 23 in the standby state. Therefore, it is necessary to assure the reliability of the gate insulating film of each of the power supply transistors 13 and 23, similarly to the case of the configuration shown in FIG. 11. A relational expression for assuring the reliability when each of the gate insulating film applied electric fields in the standby state becomes larger than that in the active state is provided by the above expressions (3) and (4).

To assure the reliability of the configuration shown in FIG. 17 in the standby state, burn-in is performed. In this case, because the ground voltage VSS1 is used, the negative voltage VSS2 supplied from the negative voltage generation circuit 22 is accelerated in the standby state.

Thus, it is possible to assure the reliability of the gate insulating film of an MIS transistor to which a large gate insulating film electric field is applied in the standby state and realize a semiconductor device of high reliability.

As described above, according to the fifth embodiment of the present invention, a two phase power supply configuration is constituted such that the reliability of an MIS transistor receiving a large gate insulating film applied electric field in the standby state is assured and thus, it is possible to realize a semiconductor device with a hierarchical power supply configuration of high reliability

[Sixth Embodiment]

Figure 19:
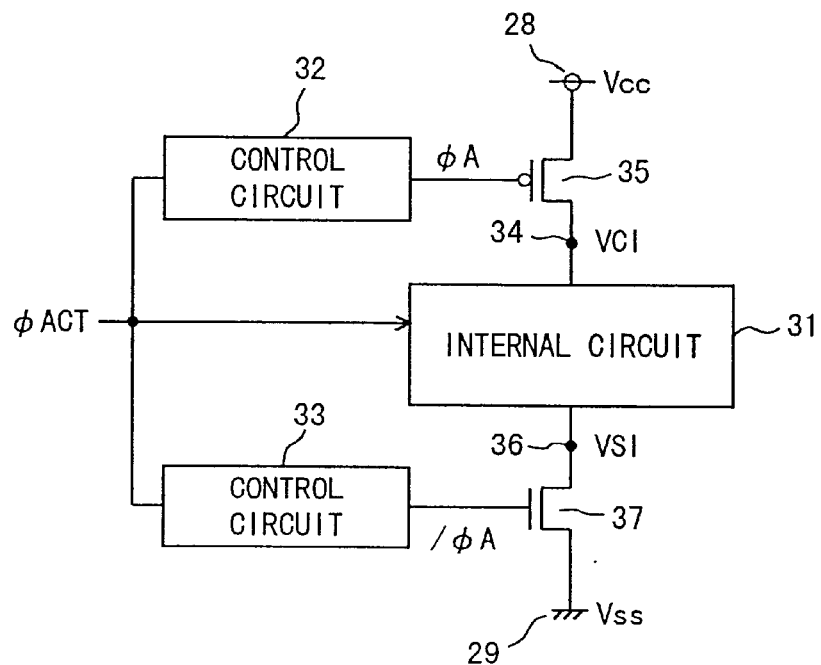
FIG. 19 is a diagram schematically showing a configuration of a semiconductor device according to a sixth embodiment of the present invention.

FIG. 19 is a diagram schematically showing a configuration of a semiconductor device according to the sixth embodiment of the present invention. In FIG. 19, the semiconductor device includes: an internal circuit 31 for executing a predetermined processing in the active state; a P-channel MIS transistor 35 connected between a main power supply node 28 and an internal power supply node 34 and selectively turned on in response to a control signal φA supplied from a control circuit 32; and an N-channel MIS transistor 37 connected between a main ground node 29 and an internal ground node 36 and selectively turned on in response to a control signal /φA supplied from a control circuit 33.

Figure 20:
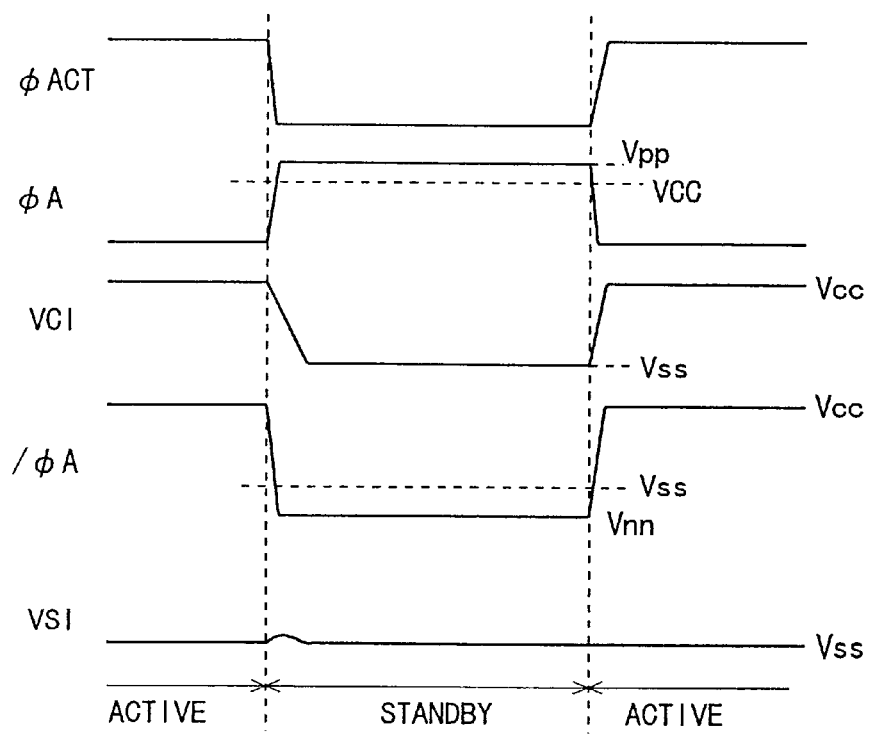
FIG. 20 is a signal waveform diagram representing operations of the semiconductor device in FIG. 19.

The control circuits 32 and 33 generate the control signal φA and the control signal /φA, respectively, in accordance with an internal circuit activation signal φACT. H level of the control signal φA is at the level of a high voltage Vpp higher than a power supply voltage Vcc while L level of the control signal /φA is at a negative voltage Vnn lower than the ground voltage Vss. Now, operations of the semiconductor device shown in FIG. 19 are described below, referring to the signal waveform diagram shown in FIG. 20.

In the active state in which the internal circuit 31 operates, the control signal φA is kept at L level of the ground voltage Vss level and the control signal /φA is kept at H level of the power supply voltage Vcc level. Therefore, the power supply transistors 35 and 37 are turned on and the power supply voltage Vcc and ground voltage Vss are transferred to the internal power supply nodes 34 and 36 of the internal circuit 31. The internal circuit 31 executes a predetermined processing in accordance with activation of an internal circuit activation signal φACT.

In the standby state of the internal circuit 31, the activation signal φACT attains the inactive state. The control circuit 32 responsively drives the control signal φA to the level of the high voltage Vpp higher than the power supply voltage Vcc, and the control circuit 33 responsively drives the control signal /φA to the level of the negative voltage Vnn lower than the ground voltage Vss. Therefore, the power supply transistors 35 and 37 each enter a deep off state, and the internal power supply node 34 and internal ground node 36 are isolated from the main power supply node 28 and main ground node 29, respectively. Therefore, supply of the power supply voltage to the internal circuit 31 is stopped, and a voltage VCI on the internal power supply node 34 is discharged to a ground voltage level. Since the power supply transistor 37 is in an off state, the voltage VSI of the internal power supply node 36 is discharged to the ground voltage level though the level of the voltage VSI is once slightly raised by a discharging current supplied from the internal circuit 31.

When the internal circuit 31 enters the active state again, the control signal φA is driven to the ground voltage level, the control signal /φA is driven to the level of the power supply voltage Vcc. Responsively, supply of the power supply voltage to the internal circuit 31 is resumed, and the internal circuit 31 executes a predetermined processing.

By bringing the power supply transistors 35 and 37 into a deep off state in the standby state of the internal circuit 31, a sub-threshold current is prevented from flowing through the power supply transistors 35 and 37, and current consumption is reduced in the standby state of the internal circuit 31.

In the case of the power supply configuration shown in FIG. 19, a voltage at the high voltage Vpp level is applied between the gate and drain of the power supply transistor 35 in the standby state. In the active state, a voltage at the power supply voltage Vcc level is applied between the gate and source of the power supply transistor 35. Therefore, also in the power supply transistor 35, an electric field applied to the gate insulating film of the transistor 35 becomes higher in the standby state compared to that in the active state of the circuit 31. Therefore, also in this case, it is necessary to make the gate insulating film applied electric field Eox (standby) in the standby state lower than a gate insulating film electric field Eox (active) in the active state, to assure the reliability of the gate insulating film of the power supply transistor 35, and to meet relational expressions same as those in the first to fifth embodiments.

In the case of the power supply transistor 37, a voltage |Vnn| is applied between the gate and source in the standby state and a voltage at the Vcc level is applied between the gate and drain/source in the active state. Therefore, for the power supply transistor 37 provided at the ground voltage side, when the reliability of the gate insulating film in the active state is assured, the reliability of the gate insulating film in the standby state is sufficiently assured. Therefore, it is necessary to assure the reliability of the gate insulating film of the power supply transistor 35 at the power supply voltage side in the standby state.

Figure 21:
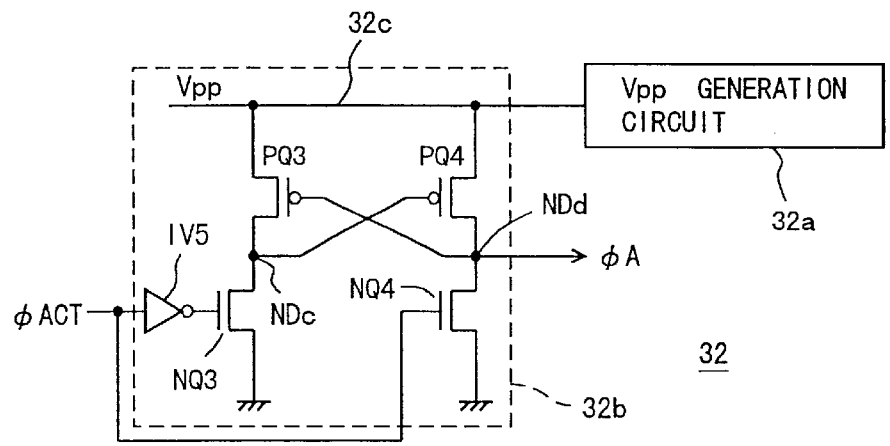
FIG. 21 is a diagram showing a configuration of the control circuit in FIG. 19.

FIG. 21 is a diagram showing a configuration of the control circuit 32 shown in FIG. 19. In FIG. 21, the control circuit 32 includes a Vpp generation circuit 32a for generating a high voltage Vpp, and a level conversion circuit 32b for converting an internal circuit activation signal φACT having an amplitude of the level of the power supply voltage Vcc into a signal having an amplitude Vpp. The level conversion circuit 32b includes an inverter IV5 for inverting the internal circuit activation signal φACT, MIS transistors PQ3 and NQ3 connected in series between a high-voltage line 32c and a ground node, and MIS transistors PQ4 and NQ4 connected in series between the high-voltage line 32c and the ground node. An output signal of the inverter IV5 is supplied to the gate of the N-channel MIS transistor NQ3 and the internal circuit activation signal φACT is supplied to the gate of the N-channel MIS transistor NQ4. The gate of the P-channel MIS transistor PQ3 is connected to a node NDd, and the gate of the P-channel MIS transistor PQ4 is connected to a node NDc. A control signal φA is output from the node NDd.

In the configuration of the control circuit 32 shown in FIG. 21, when the internal circuit activation signal φACT is kept in an H-level, active state, the MIS transistor NQ4 is turned on, the MIS transistor NQ3 is turned off, the node NDd is discharged down to the ground voltage level by the MIS transistor NQ4, and the control signal φA attains the ground voltage level. When the internal-circuit activation signal φACT is kept L-level, the MIS transistor NQ3 is turned on, the MIS transistor NQ4 is turned off, the node NDd is charged up to the high voltage level Vpp by the MIS transistor PQ4, and resultantly the control signal φA reaches the level of the high voltage Vpp.

The Vpp generation circuit 32a is constituted of, for example, a charge pump circuit. To accelerate the high voltage Vpp in the burn-in test mode, the level of the high voltage Vpp supplied from the Vpp generation circuit 32a is raised or the high voltage Vpp is applied from an outside. Thus, it is possible to accelerate the voltage stress of the gate insulating film of the power supply transistor 35 in the standby state.

As described above, according to the sixth embodiment of the present invention, the reliability of the gate insulating film in the standby of a power supply transistor for supplying a power supply voltage to an internal circuit state is adapted to be assured, it is possible to improve the reliability of the semiconductor device.

[Seventh Embodiment]
[Configuration of Negative Voltage Generation Circuit]

Figure 22:
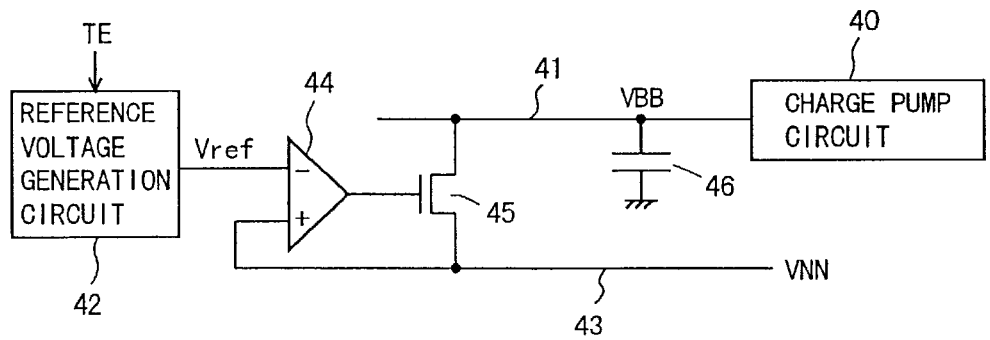
FIG. 22 is a diagram schematically showing a configuration of a negative voltage generation circuit according to a seventh embodiment of the present invention.

FIG. 22 is a diagram schematically showing a configuration of a negative voltage generation circuit. In FIG. 22, the negative voltage generation circuit includes a charge pump circuit 40 for generating a negative voltage VBB on a first negative voltage line 41 in accordance with charge pump operation, a reference voltage generation circuit 42 for generating a reference voltage Vref, a comparator 44 for comparing the reference voltage Vref with a negative voltage VNN on a second negative voltage line 43, and an N-channel MIS transistor 45 for supplying a current to the negative voltage line 41 from the negative voltage line 43 in response to an output signal of the comparator 44. A capacitance 46 for stabilization is provided to the first negative voltage line 41.

The reference voltage generation circuit 42 switches the levels of the reference voltage Vref in accordance with a burn-in mode designation signal TE. When the negative voltage VNN on the second negative voltage line 43 is higher than the reference voltage Vref, the output signal of the comparator 44 attains a high level, the conductance of the MIS transistor 45 increases, a current is supplied to the first negative voltage line 41 from the second negative voltage line 43, and the level of the negative voltage VNN is lowered. When the negative voltage VNN is lower than the reference voltage Vref, the MIS transistor 45 is turned off and no current flows between the negative voltage lines 41 and 43. Therefore, the negative voltage VNN is kept substantially at the level of the reference voltage Vref.

Figure 23:
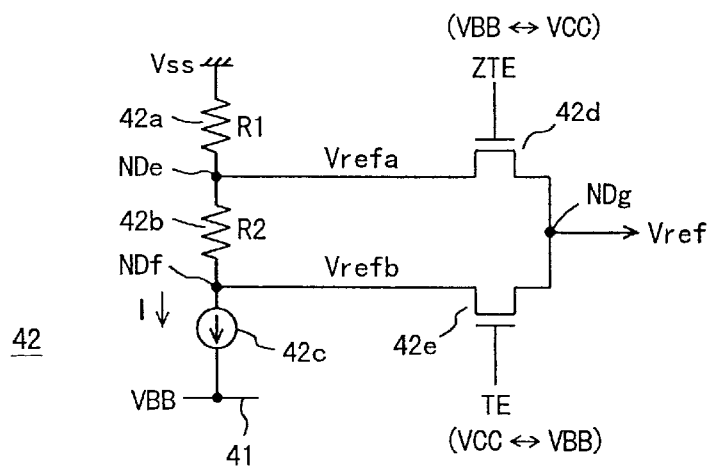
FIG. 23 is a diagram showing a configuration of the reference-voltage generation circuit in FIG. 22.

FIG. 23 is a diagram sowing a configuration of the reference voltage generation circuit 42 shown in FIG. 22. In FIG. 23, the reference voltage generation circuit 42 includes a resistive elements 42a and 42b connected in series between a ground node and a node NDf, a constant current source 42c connected between the node NDf and the first negative voltage line 41, a transfer gate 42d for transferring a voltage Vrefa on a connection node NDe between the resistive elements 42a and 42b to a node NDg in accordance with a test mode designation signal ZTE, and a transfer gate 42e for transferring a voltage Vrefb on the node NDf to the node NDg in accordance with a test mode designation signal TE.

These test mode designation signals TE and ZTE are signals complementary each other and each have an amplitude of VCC-VBB. The test mode designating signal TE in the burn-in mode under the standby state attains the level of the power supply voltage VCC, the complementary test mode designation signal ZTE attains the level of the negative voltage VBB, and the reference voltage Vrefb is selected as the reference voltage Vref. Except the burn-in mode under the standby state, the complementary test mode designation signal ZTE is at the level of the power supply voltage VCC, the test mode designation signal TE is at the level of the negative voltage VBB, and the reference voltage Vrefa is selected as the reference voltage Vref.

With a current supplied by the constant current source 42c being I, the reference voltage Vrefa is represented as —I·R1 and the reference voltage Vrefb is represented as —I·(R1+ R2). Here, R1 and R2 denote resistance values of the resistive elements 42a and 42b, respectively.

By using the reference voltage generation circuit 42 shown in FIG. 23, it is possible to accelerate the negative voltage VNN in the standby state.

[Configuration of High Voltage Generation Circuit]

Figure 24:
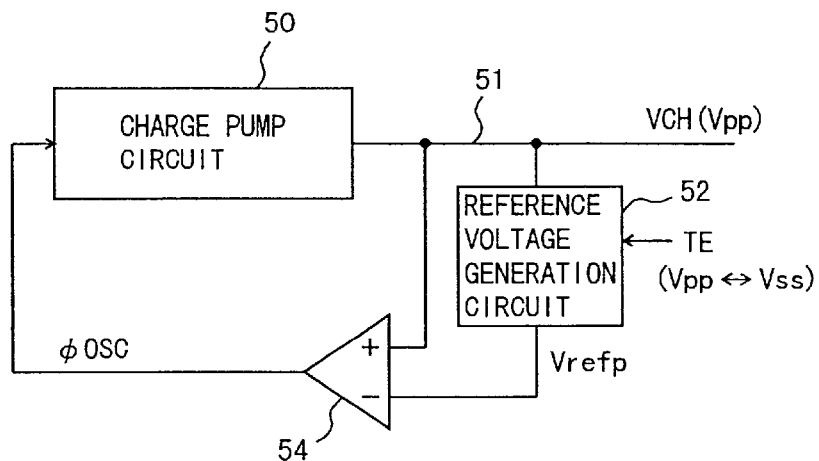
FIG. 24 is a diagram schematically showing a configuration of a high-voltage generation circuit of the seventh embodiment of the present invention.

FIG. 24 is a diagram schematically showing a configuration of a high voltage generation circuit for performing burn-in under the standby state in each embodiment of the present invention. In FIG. 24, the high voltage generation circuit includes a charge pump circuit 50 for generating a high voltage VCH (or Vpp) on a high-voltage line 51 in accordance with charge pump operations, a reference voltage generation circuit 52 receiving the voltage VCH (or Vpp) on the high-voltage line 51 as an operating power supply voltage for generating a reference voltage Vrefp, and a comparator 54 for comparing the high voltage VCH (or Vpp) on the high-voltage line 51 with the reference voltage Vrefp.

Oscillation of an oscillation circuit included in the charge pump circuit 50 is controlled in accordance with an output signal φOSC of the comparator 54. Therefore, the comparator 54 digitally operates to set the output signal φOSC to H level or L level. The reference voltage generation circuit 52 switches the levels of the reference voltage Vrefp in accordance with the test mode designation signal TE. The test mode designation signal TE changes between the high voltage VCH (or Vpp) and the ground voltage Vss.

In the configuration of the high voltage generation circuit shown in FIG. 24, when the high voltage VCH (or Vpp) on the high-voltage line 51 is higher than the reference voltage Vrefp, the comparator 54 output a H-level signal to stop charge pumping of the charge pump circuit 50 (to stop the oscillation of the internal oscillation circuit).

When the high voltage VCH (or Vpp) is lower than the reference voltage Vrefp, the comparator 54 sets the output signal φOSC to L level. Responsively, the charge pump circuit 50 starts charge pumping, supplies electric charges to the high-voltage line 51, and raises the level of the high voltage VCH. Resultantly, the high voltage VCH (or Vpp) reaches a voltage level almost equal to the reference voltage Vrefp.

Figure 25:
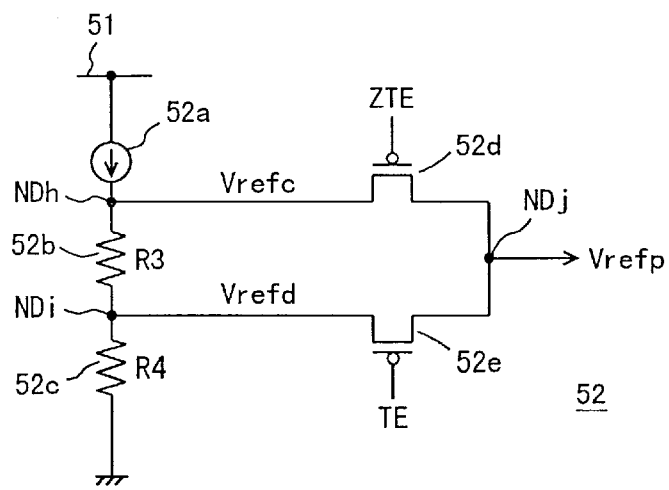
FIG. 25 is a diagram showing a configuration of the reference voltage generation circuit in FIG. 24.

FIG. 25 is a diagram showing a configuration of the reference voltage generation circuit 52 shown in FIG. 24. In FIG. 25, the reference voltage generation circuit 52 includes a constant current source 52a connected between the high-voltage line 51 and a node NDh, resistive elements 52b and 52c connected in series between the node NDh and a ground node, a transfer gate 52d to be turned on, when the complementary test mode designation signal ZTE is at an active state or L level, to transfer a reference voltage Vrefc of the node NDh to a node NDj, and a transfer gate 52e to be turned on, when the test mode designation signal TE is at inactive state or L level, to transfer a voltage Vrefd of a node NDi to the node NDj. The transfer gates 52d and 52e are each constituted of, for example, a P-channel MIS transistor.

When a burn-in test is performed, the test mode designation signal TE becomes H-level, the complementary test mode designation signal ZTE becomes L-level, and the voltage Vrefc on the node NDh is selected as the reference voltage Vrefp. When the test mode designation signal TE is kept in an inactive state, the transfer gate 52d is turned off, the transfer gate 52e is turned on, and the voltage Vrefd of the node NDi is selected as the reference voltage Vrefp.

With a current supplied by the constant-current source 52a represented as I and with resistance values of the resistive elements 52b and 52c being R3 and R4, respectively, the voltages Vrefc and Vrefd are represented by the following expressions.

$$Vrefc = I \cdot (R3 + R4)$$

$$Vrefd = I \cdot R4$$

Therefore, it is possible to raise the level of the reference voltage Vrefp and to accelerate the high voltage VCH (or Vpp).

It is possible to use a configuration same as that shown in FIG. 22 as a configuration of the high voltage generation circuit. That is, the high voltage Vpp (=VCH) is generated by a charge pump circuit to flow a current between a high-voltage line and an output signal line of the charge pump circuit in accordance with an output signal of a comparator. In this configuration, a P-channel MIS transistor is used instead of the N-channel MIS transistor 45.

Moreover, instead of the configuration of the negative voltage generation circuit shown in FIG. 22, it is possible to use a configuration same as the configuration shown in FIG. 24. By adapting the charge pump circuit to generate a negative voltage, it is possible to generate the negative voltage VNN with a configuration same as the configuration shown in FIG. 24.

[Configuration of Internal Power Supply Circuit]

Figure 26:
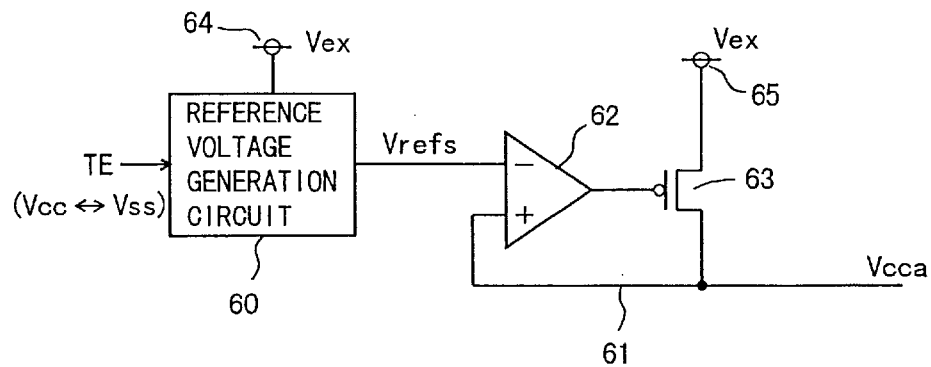
FIG. 26 is a diagram showing a configuration of an internal power supply voltage generation circuit according to the seventh embodiment of the present invention.
Figure 27:
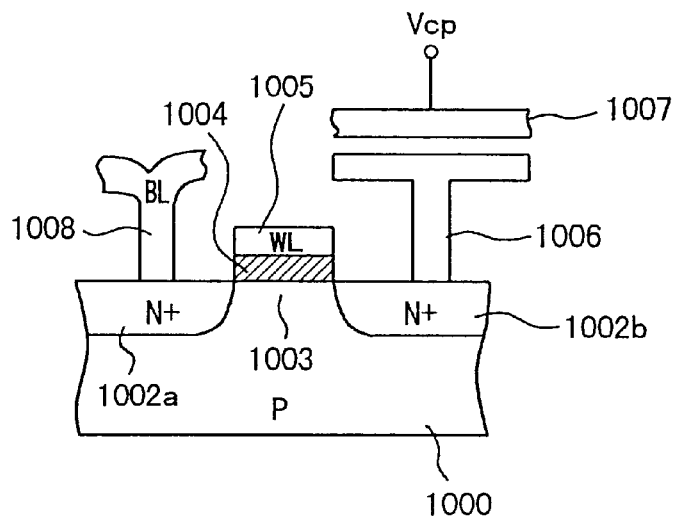
FIG. 27 is a diagram schematically showing the structure of a conventional DRAM cell.
Figure 28A:
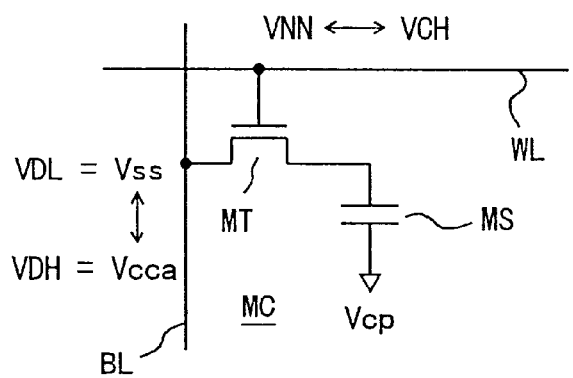
FIG. 28A is a diagram showing applied voltages of a conventional NWL scheme DRAM cell and FIG. 28B is a diagram showing voltage waveforms of a word line and a bit line.
Figure 28B:
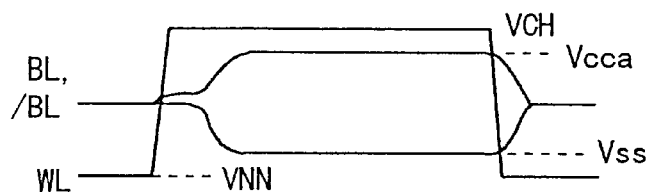
Figure 29A:
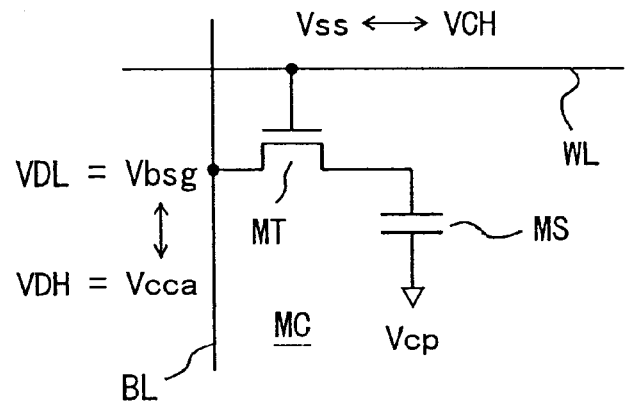
FIG. 29A is a diagram showing applied voltages of a conventional BSG scheme DRAM cell and FIG. 29B is a diagram showing voltage waveforms of a bit line and a word line of a BSG scheme memory cell.
Figure 29B:
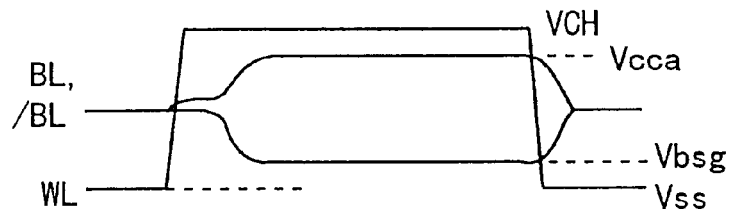
Figure 30:
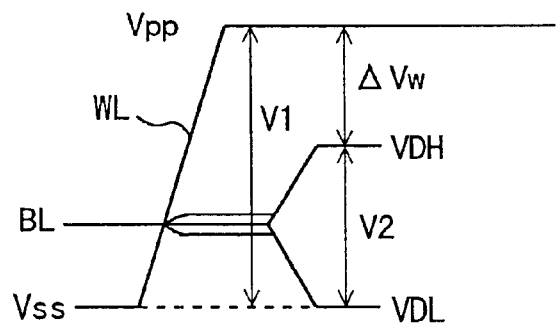
FIG. 30 is a diagram showing the voltages of word- and bit lines and reliability assuring parameters of a conventional DRAM cell.
Figure 31:
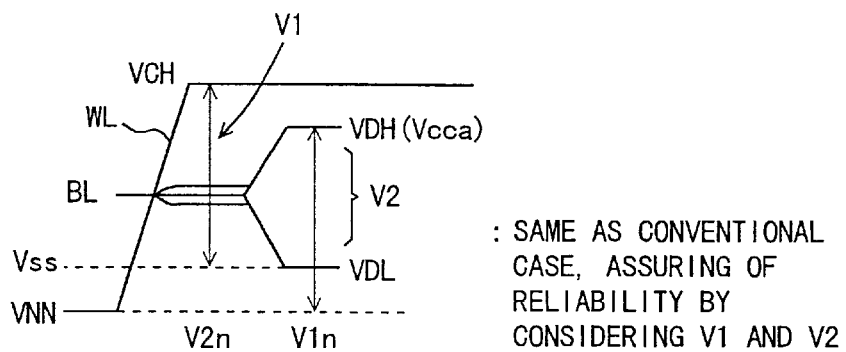
FIG. 31 is a diagram showing reliability assuring parameters and applied voltages of a gate in accordance with the conventional NWL scheme.
Figure 32:
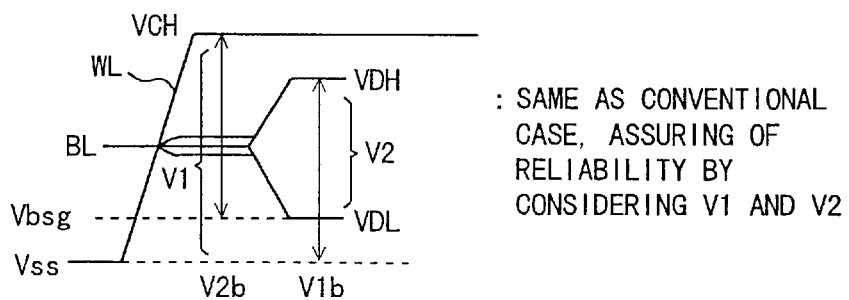
FIG. 32 is a diagram showing reliability parameters and applied voltages of the gate of a conventional BSG scheme DRAM cell.

FIG. 26 is a diagram showing a configuration of an internal power supply circuit for generating an internal power supply voltage of a semiconductor memory used for the first to fourth embodiments of the present invention. In FIG. 26, the internal power supply circuit includes a reference voltage generation circuit 60 for generating a reference voltage Vrefs, a comparator 62 for comparing the reference voltage Vrefs with an array power supply voltage Vcca on an internal power supply line 61, and a P-channel MOS transistor 63 for flowing a current from an external power supply node 65 to the internal power supply line 61. The reference voltage generation circuit 60 changes the level of the reference voltage Vrefs in accordance with the test mode designation signal TE.

The internal power supply circuit shown in FIG. 26 utilizes an internal voltage down converter VDC to set the level of the internal power supply voltage Vcca to the level of the reference voltage Vrefs. It is unnecessary to boost the test mode designation signal TE and the signal TE changes between the power supply voltage Vcc (peripheral power supply voltage or array power supply voltage) and the ground voltage Vss. By raising the reference voltage Vrefs supplied from the reference voltage generation circuit 60 in activation of the test mode designation signal TE, it is possible to raise the array power supply voltage Vcca and the high-level voltage VDH of a bit line through a sense amplifier.

The reference voltage generation circuit 60 has a configuration same as that of the reference voltage generation circuit shown in FIG. 25, and generates a reference voltage independent of the level of an external power supply voltage Vex in accordance with the external power supply voltage Vex when stabilized. The reference voltage Vrefs is set to, for example, 1.8 V in the normal operation mode and to, for example, 2.5 V in the burn-in mode.

A burn-in test is performed under the standby state of the semiconductor device. It is possible to perform burn-in of a necessary portion merely by activating the test mode designation signal TE and keeping internal circuitry in the standby state.

As described above, according to the present invention, a gate insulating film applied electric field is decreased in a standby state compared to that in an active state. Therefore, it is possible to prevent the reliability of the whole device from being determined by the reliability of an element in the standby state by making the reliability evaluation value of the gate insulating film in the standby state smaller than that of the gate insulating film in the active state, and a semiconductor device of high reliability is provided. The reliability of a gate insulating film increased as a reliability evaluation value decreases.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a bit line for transferring a signal changing between a first voltage and a second voltage higher than said first voltage;

a memory cell having an element for storing information and a selection gate for connecting said element to said bit line when selected, said selection gate being constituted of an insulated gate type field effect transistor;

a word line connected to the selection gate of said memory cell, for transferring a voltage determining selection and unselection of said element; and word line voltage applying circuitry for applying said voltage to said word line, said word line voltage applying circuitry applying a third voltage outside a voltage changing range of said bit line when said element is unselected, and applying a fourth voltage when said element is selected, said third voltage being at a level for setting a reliability evaluation value of a gate insulating film of said selection gate to, at most, a reliability evaluation value of the gate insulating film when said fourth voltage is applied.

2. The semiconductor device according to claim 1, wherein said third voltage is a negative voltage, and said first voltage is at a level of externally applied ground voltage.

3. The semiconductor device according to claim 1, wherein said word line voltage applying circuitry includes a screening circuit for accelerating stress of the gate insulating film of said selection gate in an unselected state.

4. The semiconductor device according to claim 1, wherein said word line voltage applying circuitry comprises a circuit for accelerating an electric field applied the gate insulating film of said selection gate in a selected state, and a circuit for accelerating the electric field applied to the gate insulating film of said selection gage in an unselected state.

5. The semiconductor device according to claim 1, wherein said third voltage is at a level of externally applied ground voltage, and said first voltage is at a level higher than said third voltage.

6. The semiconductor device according to claim 1, wherein said third voltage is a voltage lower than said first voltage, and said fourth voltage is a voltage higher than said second voltage.

* * * * *